United States Patent
Miyamoto

(10) Patent No.: US 11,705,541 B2
(45) Date of Patent: Jul. 18, 2023

(54) LIGHT-EMITTING DEVICE AND LIGHT-EMITTING MODULE

(71) Applicant: NICHIA CORPORATION, Anan (JP)

(72) Inventor: Kimihiro Miyamoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/853,756

(22) Filed: Apr. 21, 2020

(65) Prior Publication Data

US 2020/0343417 A1    Oct. 29, 2020

(30) Foreign Application Priority Data

Apr. 26, 2019   (JP) .............................. JP2019-085454

(51) Int. Cl.
| | | |
|---|---|---|
| *H01L 33/48* | (2010.01) | |
| *H01L 33/62* | (2010.01) | |
| *H01L 25/075* | (2006.01) | |
| *H01L 27/15* | (2006.01) | |
| *H01L 33/64* | (2010.01) | |

(52) U.S. Cl.
CPC ........ *H01L 33/486* (2013.01); *H01L 25/0753* (2013.01); *H01L 27/156* (2013.01); *H01L 33/62* (2013.01); *H01L 33/64* (2013.01)

(58) Field of Classification Search
CPC combination set(s) only.
See application file for complete search history.

(56) References Cited

U.S. PATENT DOCUMENTS

| | | | |
|---|---|---|---|
| 5,832,600 A * | 11/1998 | Hashimoto | ............. H01L 21/56 29/841 |
| 5,942,770 A | 8/1999 | Ishinaga et al. | |
| 6,093,940 A | 7/2000 | Ishinaga et al. | |
| 2007/0109806 A1 | 5/2007 | Tsukamoto et al. | |
| 2009/0039379 A1* | 2/2009 | Shiraishi | ................ H05K 3/107 257/E33.075 |
| 2009/0284130 A1 | 11/2009 | Tsuji et al. | |
| 2012/0080696 A1* | 4/2012 | Chan | ................... H01L 25/0753 257/91 |
| 2014/0301054 A1* | 10/2014 | Nagai | .................. H05K 1/0257 361/761 |
| 2014/0362570 A1 | 12/2014 | Miyoshi et al. | |
| 2015/0003039 A1 | 1/2015 | Liu et al. | |
| 2015/0021642 A1 | 1/2015 | Nakabayashi | |

(Continued)

FOREIGN PATENT DOCUMENTS

| | | |
|---|---|---|
| JP | 10-290029 | 10/1998 |
| JP | 11-163416 | 6/1999 |

(Continued)

*Primary Examiner* — Ratisha Mehta
(74) *Attorney, Agent, or Firm* — Mori & Ward, LLP

(57) ABSTRACT

A light-emitting device includes a mounting substrate having a first surface and a second surface opposite to the first surface, the mounting substrate having a first end portion at an end of the mounting substrate; light-emitting elements mounted on the first surface of the mounting substrate other than the first end portion; first terminals provided on the first surface at the first end portion of the mounting substrate and connected to the light-emitting elements; and second terminals provided on the second surface at the first end portion of the mounting substrate and connected to the light-emitting elements.

19 Claims, 25 Drawing Sheets

(56) References Cited

U.S. PATENT DOCUMENTS

| | | |
|---|---|---|
| 2015/0171281 A1 | 6/2015 | Nakabayashi et al. |
| 2015/0340575 A1 | 11/2015 | Nakabayashi et al. |
| 2016/0095184 A1 | 3/2016 | Nakabayashi et al. |
| 2016/0372514 A1* | 12/2016 | Chang .................. G09G 3/2003 |
| 2016/0372515 A1 | 12/2016 | Miyoshi et al. |
| 2017/0154880 A1 | 6/2017 | Ozeki et al. |
| 2018/0053886 A1* | 2/2018 | Goto .................... H05K 1/0306 |
| 2018/0058667 A1 | 3/2018 | Matsuda et al. |
| 2018/0069162 A1 | 3/2018 | Abe et al. |
| 2018/0240948 A1 | 8/2018 | Nakanishi et al. |

FOREIGN PATENT DOCUMENTS

| | | |
|---|---|---|
| JP | 2001-177156 | 6/2001 |
| JP | 2002-111065 | 4/2002 |
| JP | 2003-078176 | 3/2003 |
| JP | 2004-193357 | 7/2004 |
| JP | 2004-241509 | 8/2004 |
| JP | 2007-141549 | 6/2007 |
| JP | 2009-260073 | 11/2009 |
| JP | 2014-026995 | 2/2014 |
| JP | 2014-236175 | 12/2014 |
| JP | 2015-012293 | 1/2015 |
| JP | 2015-038963 | 2/2015 |
| JP | 2015-207754 | 11/2015 |
| JP | 2016-001724 | 1/2016 |
| JP | 2016-072435 | 5/2016 |
| JP | 2017-011259 | 1/2017 |
| JP | 2017-108092 | 6/2017 |
| JP | 2018-037196 | 3/2018 |
| JP | 2018-041843 | 3/2018 |
| JP | 2018-133522 | 8/2018 |
| JP | 2018-195706 | 12/2018 |
| WO | WO 2013/114977 | 8/2013 |

* cited by examiner

LIGHT-EMITTING DEVICE AND LIGHT-EMITTING MODULE

CROSS-REFERENCE TO RELATED APPLICATIONS

This application is based upon and claims the benefit of priority from the prior Japanese Patent Application No. 2019-085454, filed on Apr. 26, 2019; the entire contents of which are incorporated herein by reference.

FIELD

Embodiments relate to a light-emitting device and a light-emitting module.

BACKGROUND

A vehicle light fixture has been developed in recent years in which a light-emitting diode (LED) is used as a light-emitting element. In a vehicle light fixture requiring high luminance such as a headlamp, it is necessary to mount many light-emitting elements with high density on one mounting substrate. On the other hand, an adaptive driving beam (ADB) has been developed for automobile headlamps in which light is irradiated only on a selected area. In such a case, it is desirable to be able to individually control the light-emitting elements. To individually control the light-emitting elements, it is necessary to provide terminals in the mounting substrate for each light-emitting element.

Thus, it is necessary to mount many light-emitting elements and provide many terminals on the mounting substrate. In such a case, when ensuring the distance between the terminals, the area where the terminals are provided undesirably increases and inhibits downsizing of the light-emitting device. Also, when assembling a light-emitting module by using wires to connect the terminals of the mounting substrate to a circuit board on the power supply side, it is necessary to ensure the distance between the wires to avoid interference between the wires. Downsizing of the light-emitting module is inhibited thereby.

SUMMARY

A light-emitting device according to an embodiment of the invention includes a mounting substrate having a first surface and a second surface opposite to the first surface, the mounting substrate having a first end portion at an end of the mounting substrate; light-emitting elements mounted on the first surface of the mounting substrate other than the first end portion; first terminals provided on the first surface at the first end portion of the mounting substrate and connected to the light-emitting elements; and second terminals provided on the second surface at the first end portion of the mounting substrate and connected to the light-emitting elements.

A light-emitting device according to an embodiment of the invention includes: a mounting substrate having a first surface and a second surface opposite to the first surface, the mounting substrate having a first end portion at an end of the mounting substrate; light-emitting elements mounted at the first surface of the mounting substrate; and a first terminal provided at the first end portion of the mounting substrate, exposed at the first surface and the second surface, and connected to at least one of the light-emitting elements.

A light-emitting module according to an embodiment of the invention includes the light-emitting device and a first connector. The first connector clamps the first end portion of the mounting substrate. The first connector includes a first lead connected to the first terminals, and a second lead connected to the second terminals.

DETAILED DESCRIPTION

First Embodiment

Figure 1:
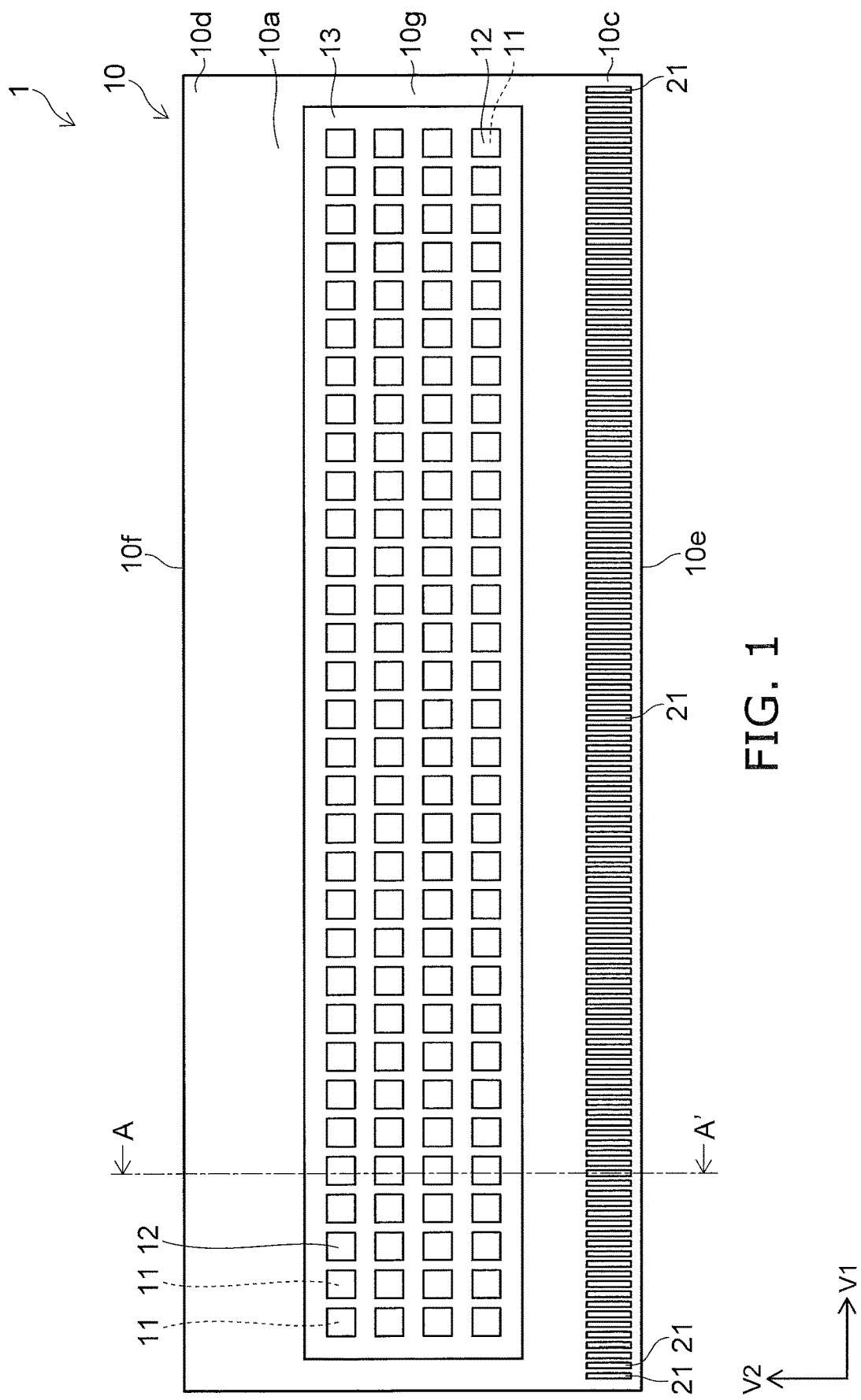
FIG. 1 is a front view showing a light-emitting device according to a first embodiment.

First, a light-emitting device according to the embodiment will be described.

The light-emitting device 1 according to the embodiment includes: a mounting substrate 10 having a first surface 10a, and a second surface 10b opposite to the first surface 10a; multiple light-emitting elements 11 mounted at the first surface 10a of the mounting substrate 10; a first terminal 21 provided at the first surface 10a of a first end portion 10c of the mounting substrate 10 and connected to at least one of the light-emitting elements 11; and a second terminal 22 provided at the second surface 10b of the first end portion 10c of the mounting substrate 10 and connected to at least one of the light-emitting elements 11. In the specification, "connected" means an electrical connection.

A more detailed description follows.

Figure 2:
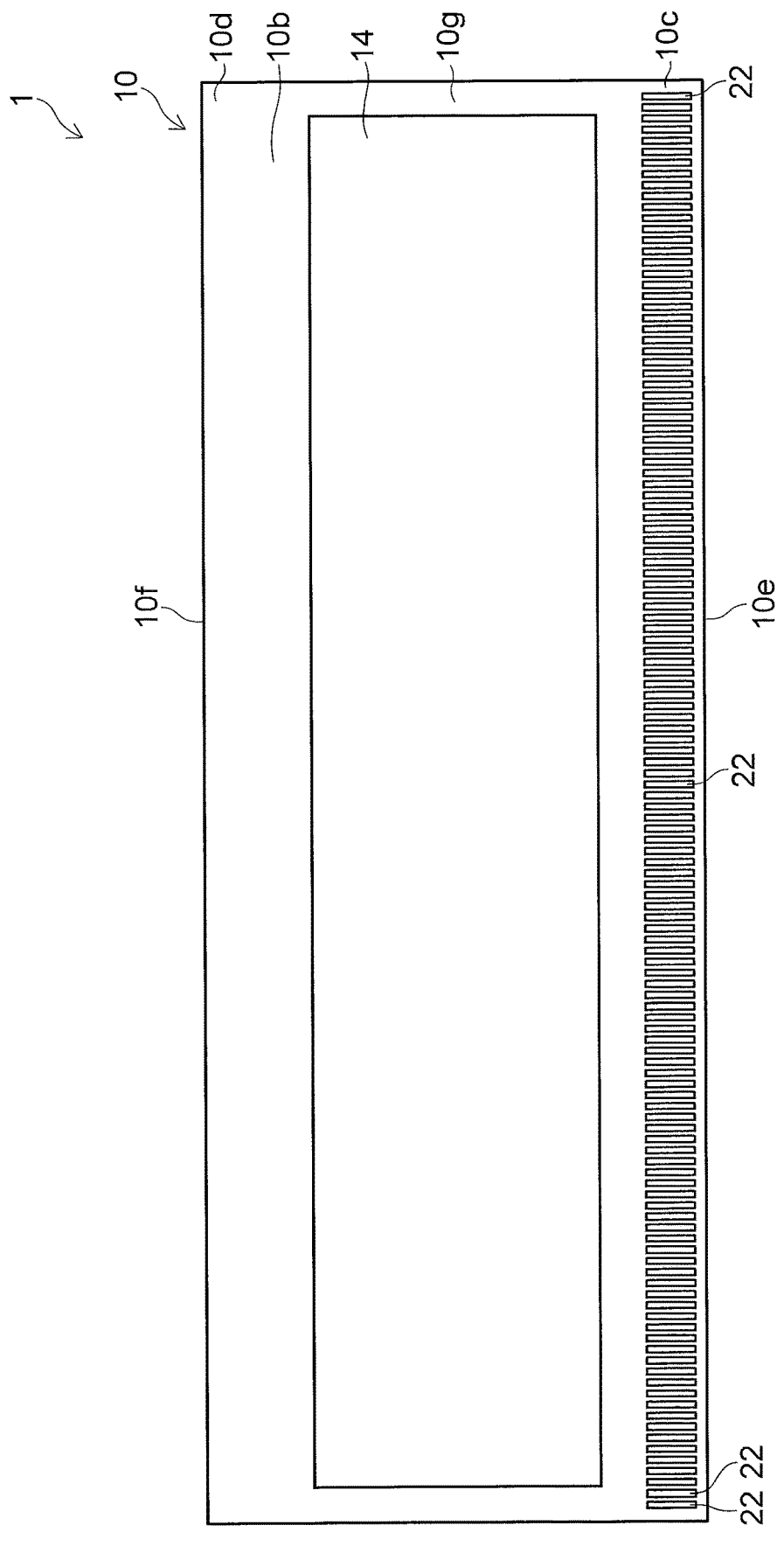
FIG. 2 is a rear view showing the light-emitting device according to the first embodiment.
Figure 3:
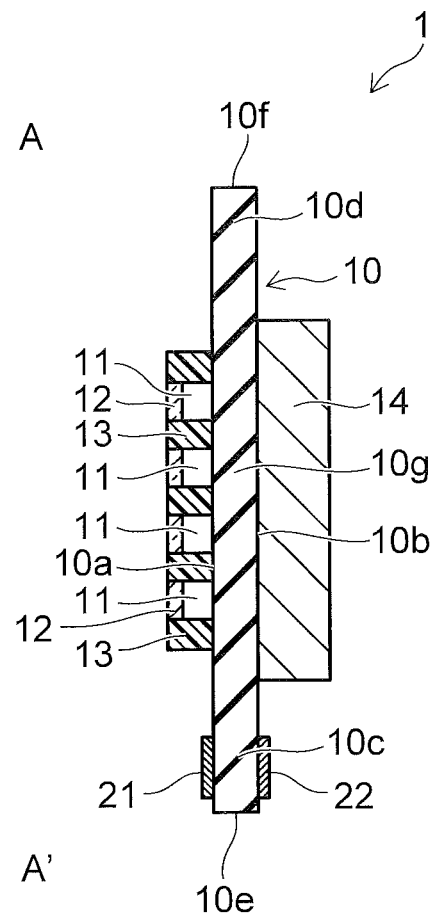
FIG. 3 is a cross-sectional view showing the light-emitting device according to the first embodiment and shows a cross section along line A-A' shown in FIG. 1.

As shown in FIG. 1 to FIG. 3, the mounting substrate 10 is provided in the light-emitting device 1 according to the embodiment. In the mounting substrate 10, a multilayer interconnect is provided in an insulative main material. The mounting substrate 10 has a substantially rectangular plate configuration and has the first surface 10a and the second surface 10b as major surfaces. The second surface 10b is opposite to the first surface 10a. The longitudinal direction of the mounting substrate 10 is taken as a first direction V1, the transverse direction of the mounting substrate 10 is taken as a second direction V2, and an edge 10e of the first end portion 10c and an edge 10f of a second end portion 10d of the mounting substrate 10 are along the first direction V1. The first end portion 10c and the second end portion 10d are positioned at mutually-opposite sides in the second direction V2. For example, the first direction V1 and the second direction V2 are orthogonal.

The multiple light-emitting elements 11 are mounted at the first surface 10a of a central portion 10g of the mounting substrate 10 other than the first end portion 10c and the second end portion 10d. The light-emitting elements 11 are, for example, light-emitting diodes (LEDs) and are supplied with electrical power via the interconnect of the mounting substrate 10. For example, the light-emitting elements 11 are arranged in a matrix configuration along the first direction V1 and the second direction V2. In the example shown in FIG. 1 to FIG. 3, the light-emitting elements 11 are arranged to be thirty-two along the first direction V1 and four along the second direction V2. Accordingly, the total number of the light-emitting elements 11 is 128.

The first terminal 21 is provided at the first surface 10a of the first end portion 10c of the mounting substrate 10. The first terminal 21 is connected to at least one of the light-emitting elements 11 via the interconnect of the mounting substrate 10. The second terminal 22 is provided at the second surface 10b of the first end portion 10c of the mounting substrate 10. The second terminal 22 is connected to at least one of the light-emitting elements 11 via the interconnect of the mounting substrate 10. The first terminal 21 and the second terminal 22 are, for example, films made of a metal such as gold, copper, etc., and have, for example, rectangular configurations when viewed in plan.

For example, multiple first terminals 21 are arranged in one column on the first surface 10a along the edge 10e of the first end portion 10c. Also, for example, multiple second terminals 22 are arranged in one column on the second surface 10b along the edge 10e of the first end portion 10c. The first terminals 21 are separated from each other, and the second terminals 22 also are separated from each other. In the embodiment, terminals are not provided at the second end portion 10d of the mounting substrate 10.

For example, the total number of the first terminals 21 and the second terminals 22 is 2 times the number of the light-emitting elements 11. For example, the number of the first terminals 21 is equal to the number of the light-emitting elements 11, and the number of the second terminals 22 also is equal to the number of the light-emitting elements 11. In the example shown in FIG. 1 to FIG. 3, the number of the light-emitting elements 11 is 128; therefore, the number of the first terminals 21 and the number of the second terminals 22 are 128 respectively, and the total number of the first terminals 21 and the second terminals 22 is 256. The number of terminals fluctuates and is dependent on the circuit design, and therefore is not limited to the example.

A fluorescer layer 12 is provided on a light-emitting surface of each light-emitting element 11. In the fluorescer layer 12, for example, fluorescer particles are provided in a main material made of a transparent resin. A reflective layer 13 is provided on the first surface 10a of the central portion 10g of the mounting substrate 10. The reflective layer 13 is not provided in the region of the first surface 10a of the mounting substrate 10 where the light-emitting elements 11 and the fluorescer layers 12 are mounted, and the reflective layer 13 does not cover the fluorescer layers 12. Therefore, the reflective layer 13 has a lattice configuration surrounding stacked bodies made of the light-emitting elements 11 and the fluorescer layers 12. The reflective layer 13 does not cover the first terminal 21. The reflective layer 13 is made of an insulating resin material. The material of the reflective layer 13 may be a white resin material that is light-reflective, a transparent resin material that is light-transmissive, or a black resin material that is light-shielding.

A heat dissipation member 14 is provided at the second surface 10b of the central portion 10g of the mounting substrate 10 and contacts the second surface 10b. The heat dissipation member 14 is, for example, a block-shaped member made of a material having a high thermal conductivity such as copper, etc. The heat dissipation member 14 does not contact the second terminal 22.

A light-emitting module according to the embodiment will now be described.

The light-emitting module 51 according to the embodiment includes the light-emitting device 1 described above and a first connector 61. The first connector 61 clamps the first end portion 10c of the mounting substrate 10. The first connector 61 includes a first lead 71 connected to the first terminal 21, and a second lead 72 connected to the second terminal 22.

A more detailed description follows.

Figure 4:
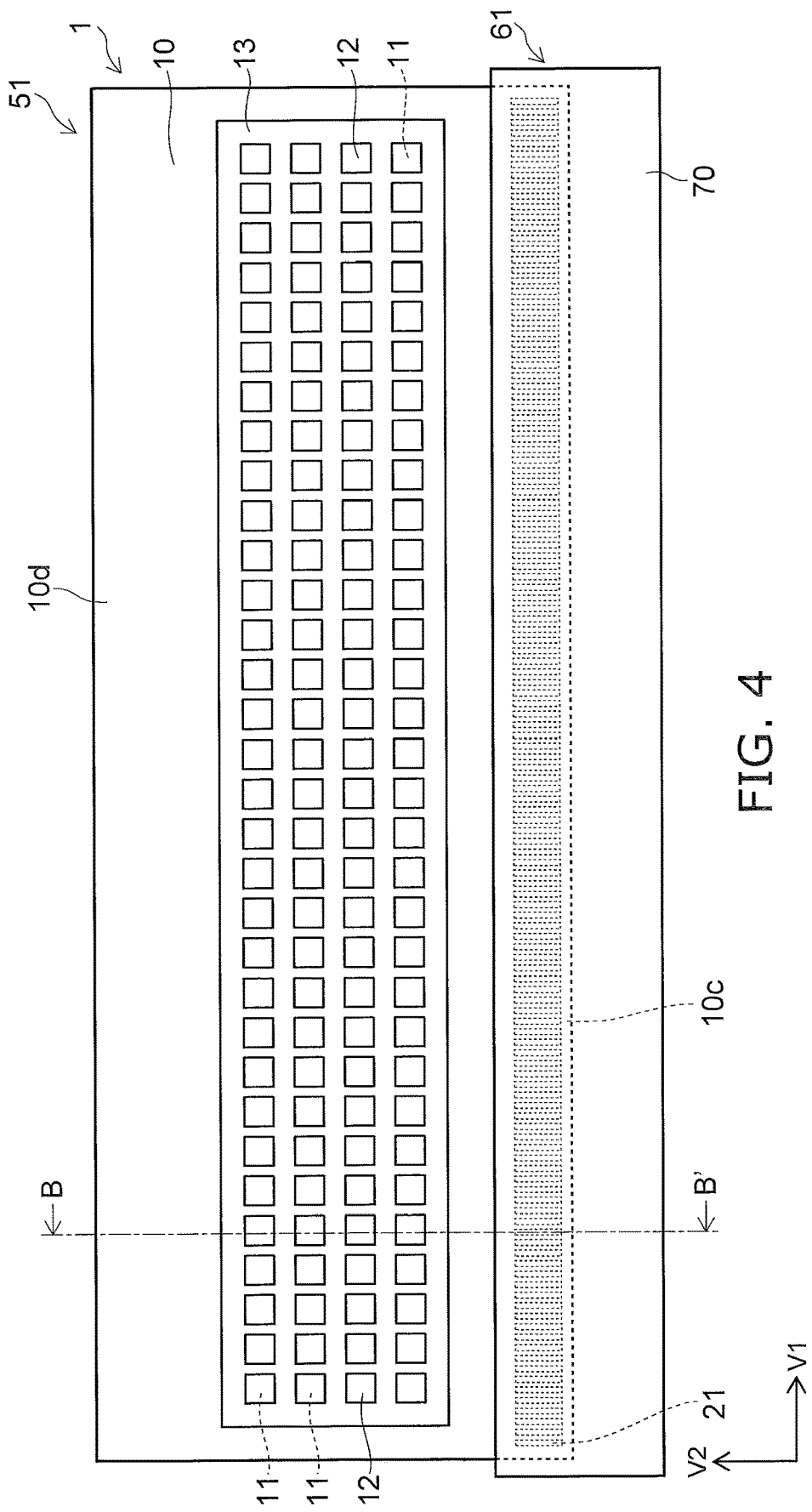
FIG. 4 is a front view showing a light-emitting module according to the first embodiment.
Figure 5:
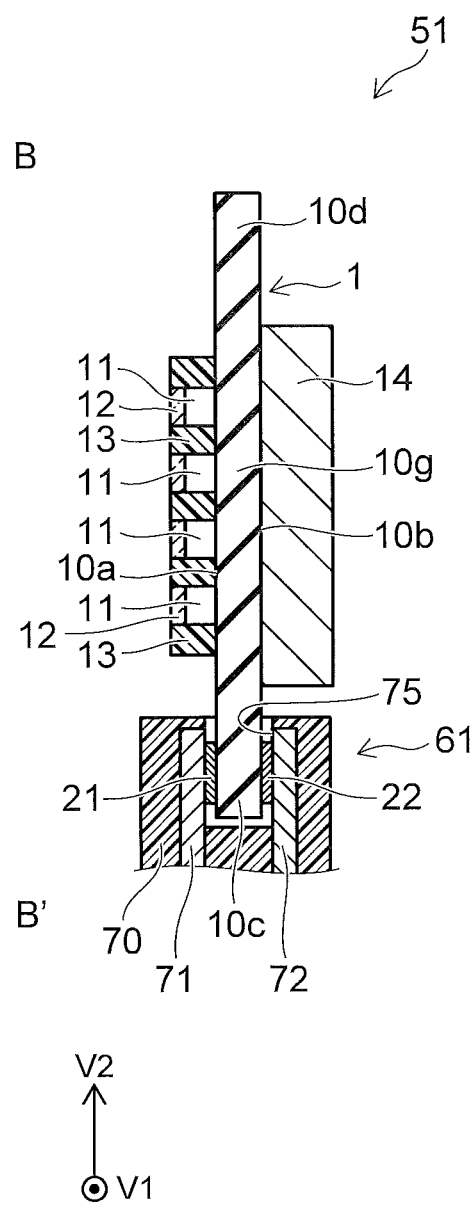
FIG. 5 is a cross-sectional view showing the light-emitting module according to the first embodiment and shows a cross section along line B-B' shown in FIG. 4.

As shown in FIG. 4 and FIG. 5, the light-emitting device 1 described above and the first connector 61 are provided in the light-emitting module 51. An insulative housing 70 is provided in the first connector 61. A recess 75 is provided in the housing 70. The recess 75 has a trench configuration. The first end portion 10c of the mounting substrate 10 of the light-emitting device 1 is insertable into the recess 75.

The first lead 71 and the second lead 72 are provided in the first connector 61. The first lead 71 and the second lead 72 are held by the housing 70 and exposed at the inner surface of the recess 75. The number and the arrangement interval of the first leads 71 are the same as the number and the arrangement interval of the first terminals 21 of the light-emitting device 1. The number and the arrangement interval of the second leads 72 are the same as the number and the arrangement interval of the second terminals 22 of the light-emitting device 1.

When the first end portion 10c of the mounting substrate 10 of the light-emitting device 1 is inserted into the recess 75, the first lead 71 presses the first terminal 21 and is connected to the first terminal 21. Also, the second lead 72 presses the second terminal 22 and is connected to the second terminal 22. Thereby, the first connector 61 clamps the first end portion 10c of the mounting substrate 10 of the light-emitting device 1 from both the first surface 10a side and the second surface 10b side. Thus, the light-emitting device 1 is fixed to the first connector 61 by inserting the first end portion 10c of the mounting substrate 10 into the recess 75.

It is favorable for the first lead 71 and the second lead 72 to be springlike. Thereby, the light-emitting device 1 is inserted into the recess 75 when a force not less than a prescribed value is applied to the light-emitting device 1 in the direction into the recess 75. Then, the first terminal 21 is reliably pressed due to the springlike property of the first lead 71, and the second terminal 22 is reliably pressed due to the springlike property of the second lead 72. Thereby, the first lead 71 is connected reliably to the first terminal 21, and the second lead 72 is connected reliably to the second terminal 22. The light-emitting device 1 is detached from the recess 75 when a force not less than a prescribed value is applied to the light-emitting device 1 in the direction away from the recess 75. Thereby, the light-emitting device 1 is detachable from the first connector 61 while preventing the light-emitting device 1 from falling out of the first connector 61.

Effects of the embodiment will now be described.

In the light-emitting device 1 according to the embodiment, the first terminals 21 and the second terminals 22 are provided at the mounting substrate 10 and connected to the light-emitting elements 11. Thereby, the light-emitting elements 11 can be controlled individually or independently for each group. As a result, for example, the light-emitting device 1 can be utilized as the light source of an adaptive driving beam (ADB). In particular, when the total number of the first terminals 21 and the second terminals 22 is 2 times the number of the light-emitting elements 11, potentials can be applied independently to the anode and the cathode of each light-emitting element 11.

In the light-emitting device 1, the first terminals 21 are provided at the first surface 10a of the mounting substrate 10, and the second terminals 22 are provided at the second surface 10b of the mounting substrate 10. Thus, in the light-emitting device 1, the number of the first terminals 21 at the first surface 10a and the number of the second terminals 22 at the second surface 10b can be reduced because the first terminals 21 and the second terminals 22 are dispersed at two surfaces of the mounting substrate 10. As a result, the layout area of the first terminals 21 at the first surface 10a and the layout area of the second terminals 22 at the second surface 10b can be reduced, and the light-emitting device 1 can be downsized.

The heat dissipation member 14 is provided in the light-emitting device 1, and the heat dissipation member 14 contacts the second surface 10b of the mounting substrate 10. Thereby, the heat that is generated by the light emission of the light-emitting elements 11 flows into the heat dissipation member 14 via the mounting substrate 10 and is dissipated outside the light-emitting device 1 from the heat dissipation member 14. As a result, the heat dissipation of the light-emitting device 1 can be improved.

In the light-emitting module 51 according to the embodiment, the first connector 61 clamps the first end portion 10c of the mounting substrate 10 by inserting the first end portion 10c of the mounting substrate 10 of the light-emitting device 1 into the recess 75 of the first connector 61. Thereby, the light-emitting device 1 can be fixed to the first connector 61. At this time, the first terminal 21 of the light-emitting device 1 is connected to the first lead 71 of the first connector 61, and the second terminal 22 of the light-emitting device 1 is connected to the second lead 72 of the first connector 61. Thereby, it is possible to supply the electrical power from the first connector 61 to the light-emitting elements 11 of the light-emitting device 1.

Thus, according to the embodiment, the light-emitting device 1 can be mechanically fixed with respect to the first connector 61 and electrically connected to the first connector 61 by the simple operation of inserting the first end portion 10c of the mounting substrate 10 into the recess 75 of the first connector 61. Therefore, in the embodiment, for example, a bonding process of wire bonding to the first terminals 21 or the like is unnecessary. The manufacturing cost of the light-emitting module 51 can be reduced thereby.

Modification of First Embodiment

A modification of the first embodiment will now be described.

The front view showing a light-emitting device according to the modification is similar to FIG. 1, and the rear view showing the light-emitting device according to the modification is similar to FIG. 2.

Figure 6:
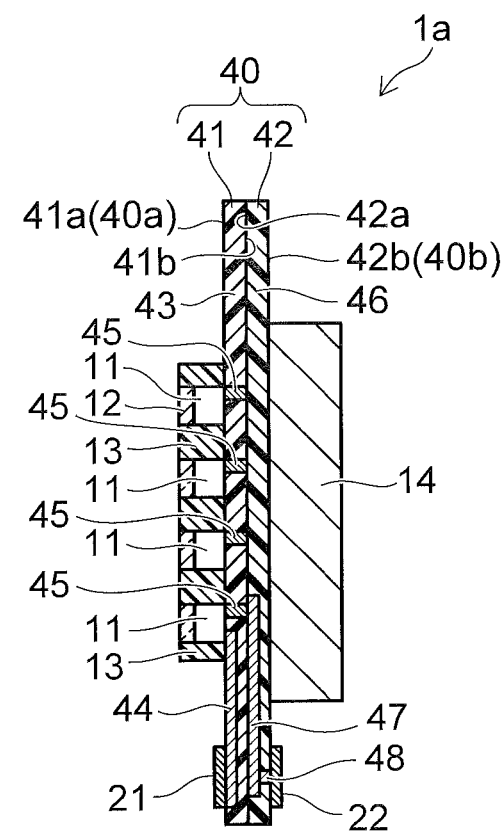
FIG. 6 is a cross-sectional view showing a light-emitting device according to a modification of the first embodiment.

In the light-emitting device 1a according to the modification as shown in FIG. 6, a stacked substrate is provided as a mounting substrate 40. A first interconnect layer 41 and a second interconnect layer 42 are stacked in the mounting substrate 40. A first surface 41a of the first interconnect layer 41 is a first surface 40a of the mounting substrate 40, and a second surface 41b of the first interconnect layer 41 contacts a first surface 42a of the second interconnect layer 42. A second surface 42b of the second interconnect layer 42 is a second surface 40b of the mounting substrate 40. The light-emitting elements 11 are mounted at the first surface 40a of the mounting substrate 40. The heat dissipation member 14 contacts the second surface 40b of the mounting substrate 40.

An insulative main material 43 is provided in the first interconnect layer 41. An interconnect 44 and a via 45 are provided in the main material 43. A portion of the interconnect may be exposed at the first surface 41a of the first interconnect layer 41. The remainder of the interconnect 44 may be covered with an insulating film. The via 45 extends through the first interconnect layer 41 in the thickness direction. The number of the interconnects 44 and the number of the vias are, for example, the same as the number of the light-emitting elements 11.

An insulative main material 46 is provided in the second interconnect layer 42. An interconnect 47 and a via 48 are provided in the main material 46. A portion of the interconnect 47 may be exposed at the first surface 42a of the second interconnect layer 42. The remainder of the interconnect 47 may be covered with an insulating film. The via 48 is connected to the interconnect 47 and exposed at the second surface 42b of the second interconnect layer 42. The number of the interconnects 47 and the number of the vias 48 are, for example, the same as the number of the light-emitting elements 11.

An example of the connection between the light-emitting elements 11 and the first and second terminals 21 and 22 will now be described.

One first terminal 21 is connected to the anode of one light-emitting element 11 via the interconnect 44 of the first interconnect layer 41. One second terminal 22 is connected to the cathode of the one light-emitting element 11 by the via 48 of the second interconnect layer 42, the interconnect 47 of the second interconnect layer 42, and the via 45 of the first interconnect layer 41. For example, the anode of each light-emitting element 11 is connected to some first terminal 21 via some interconnect 44. The cathode of each light-emitting element 11 is connected to some second terminal 22 by some via 45, some interconnect 47, and some via 48. However, the connectional relationship between the anode and the cathode of the light-emitting element 11 and the first and second terminals 21 and 22 is not limited to the example described above. For example, the anode and the cathode of one light-emitting element 11 may be connected to two first terminals 21 via two interconnects 44 of the first interconnect layer 41. Also, the anode and the cathode of another one light-emitting element 11 may be connected to two second terminals 22 by two vias 45 of the first interconnect layer 41, two interconnects 47 of the second interconnect layer 42, and two vias 48 of the second interconnect layer 42.

In the modification, the interconnect density in the mounting substrate 40 can be reduced by using a stacked substrate as the mounting substrate 40. Three or more interconnect layers may be provided in the mounting substrate 40. Thereby, the interconnect density in the mounting substrate 40 can be reduced even more. Otherwise, the configuration and the effects of the modification are similar to those of the first embodiment.

Second Embodiment

A second embodiment will now be described.

Figure 7:
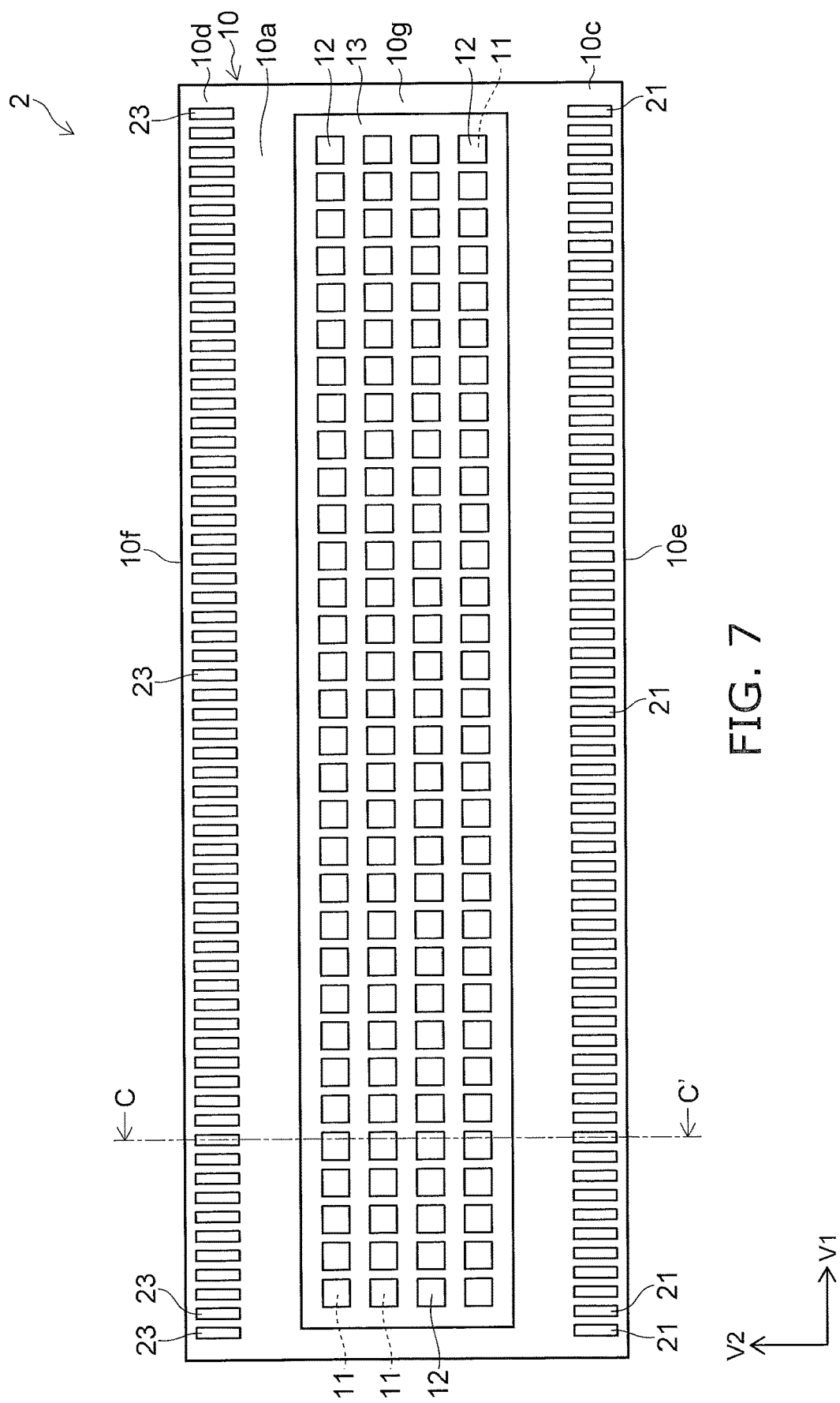
FIG. 7 is a front view showing a light-emitting device according to a second embodiment.
Figure 8:
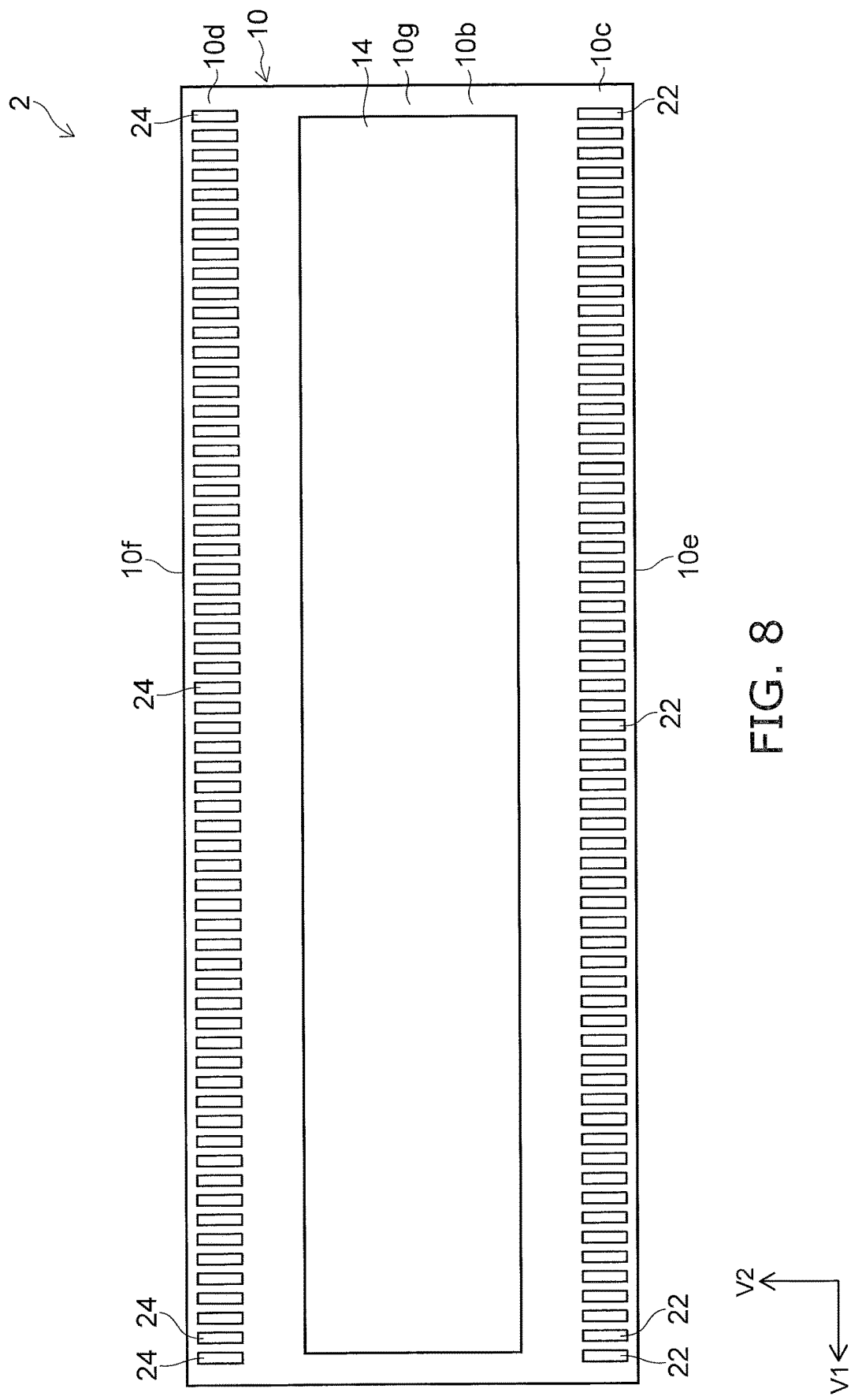
FIG. 8 is a rear view showing the light-emitting device according to the second embodiment.
Figure 9:
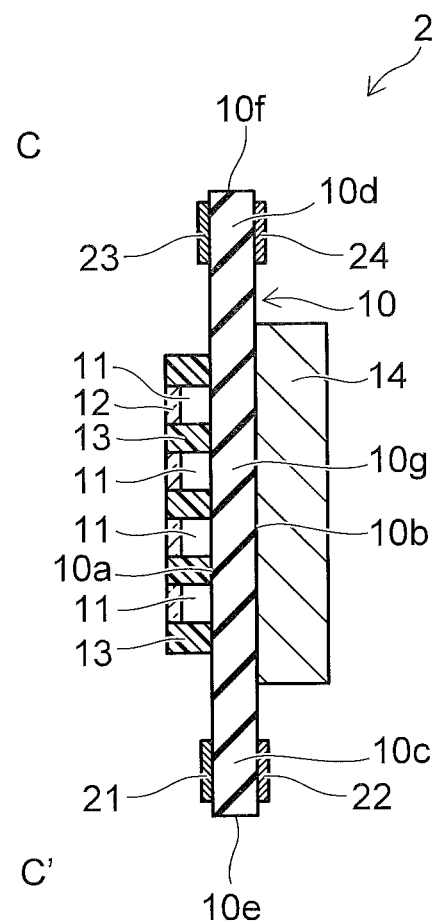
FIG. 9 is a cross-sectional view showing the light-emitting device according to the second embodiment and shows a cross section along line C-C' shown in FIG. 7.

As shown in FIG. 7 to FIG. 9, a light-emitting device 2 according to the embodiment differs from the light-emitting device 1 according to the first embodiment in that third terminals 23 and fourth terminals 24 are provided in the second end portion 10d of the mounting substrate 10. The third terminals 23 are provided at the first surface 10a of the second end portion 10d of the mounting substrate 10 and arranged in one column along the edge 10f of the second end portion 10d. The fourth terminals 24 are provided at the second surface 10b of the second end portion 10d of the mounting substrate 10 and arranged in one column along the edge 10f of the second end portion 10d. The third terminals 23 and the fourth terminals 24 are connected to the light-emitting elements 11. For example, the configurations of the third terminals 23 and the fourth terminals 24 are respectively the same as the configurations of the first terminals 21 and the second terminals 22 and are, for example, metal films.

In the light-emitting device 2, the total number of the first terminals 21, the second terminals 22, the third terminals 23, and the fourth terminals 24 is, for example, equal to 2 times the number of the light-emitting elements 11. Accordingly, for example, the number of the light-emitting elements 11 of the light-emitting device 2 is the same as the number of the light-emitting elements 11 of the light-emitting device 1 according to the first embodiment, and if the numbers are the same between the first terminals 21, the second terminals 22, the third terminals 23, and the fourth terminals 24, then the numbers of the first terminals 21, the second terminals 22, the third terminals 23, and the fourth terminals 24 of the light-emitting device 2 are half of the number of the first terminals 21 of the light-emitting device 1. In the example shown in FIG. 7 to FIG. 9, the numbers of the first terminals 21, the second terminals 22, the third terminals 23, and the fourth terminals 24 are 64. As a result, according to the embodiment, the layout area of the first terminals 21, the second terminals 22, the third terminals 23, and the fourth terminals 24 can be reduced, or the arrangement density can be reduced.

A light-emitting module according to the embodiment will now be described.

Figure 10:
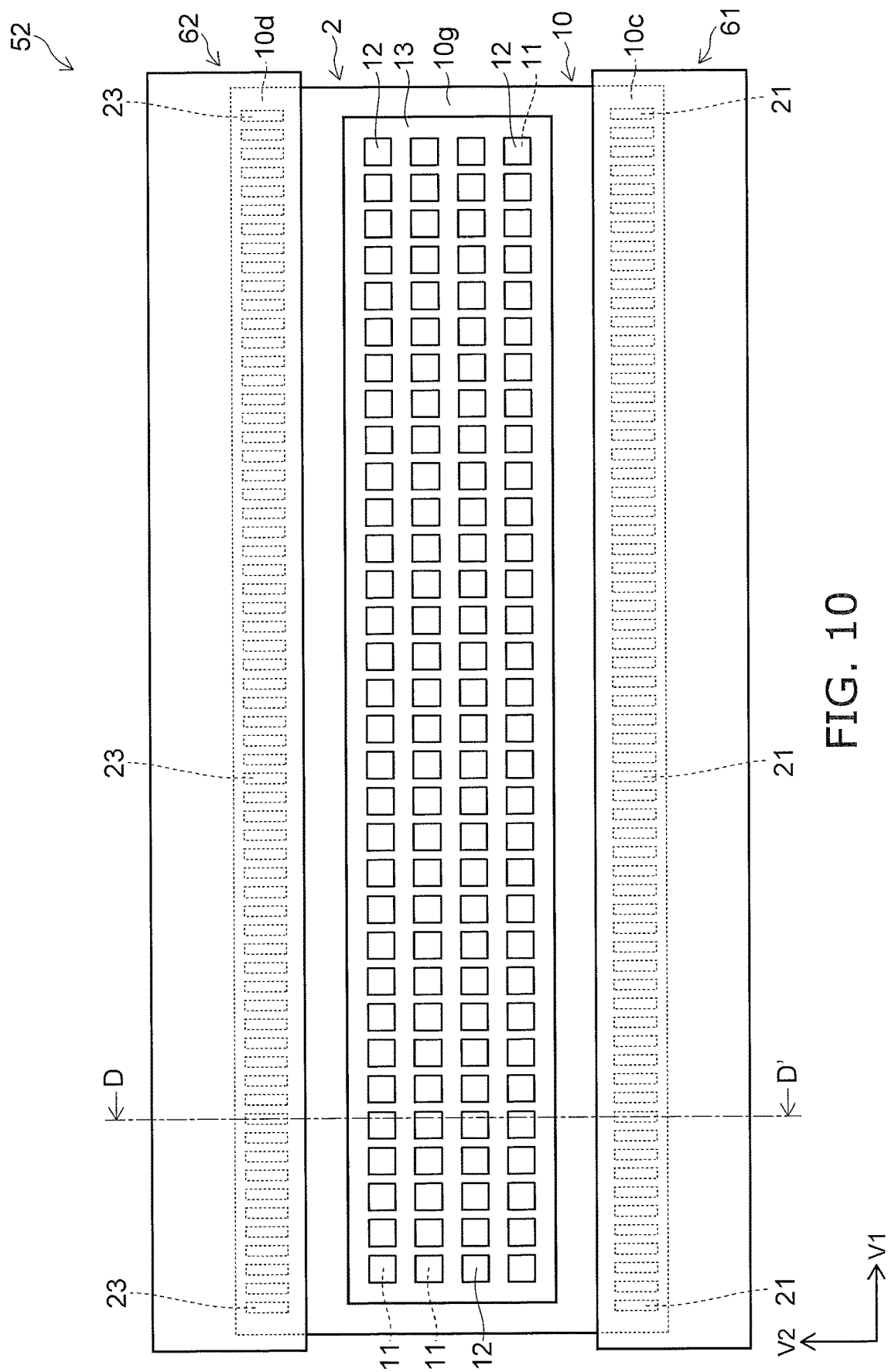
FIG. 10 is a front view showing a light-emitting module according to the second embodiment.
Figure 11:
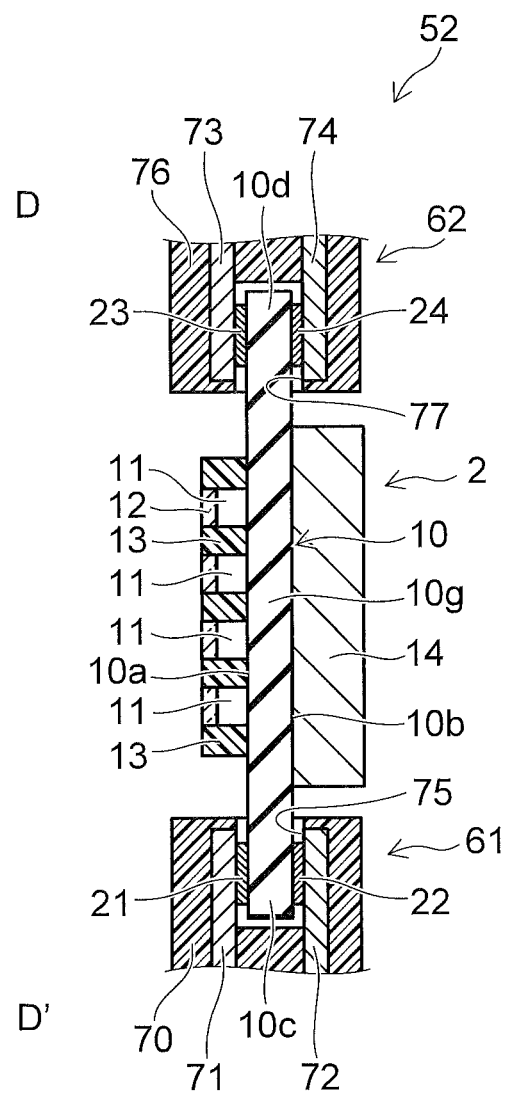
FIG. 11 is a cross-sectional view showing the light-emitting module according to the second embodiment and shows a cross section along line D-D' shown in FIG. 10.

As shown in FIG. 10 and FIG. 11, the light-emitting module 52 according to the embodiment includes the light-emitting device 2 described above, the first connector 61, and a second connector 62. The first connector 61 clamps the first end portion 10c of the mounting substrate 10 of the light-emitting device 2, and the second connector 62 clamps the second end portion 10d of the mounting substrate 10 of the light-emitting device 2.

In the first connector 61, similarly to the first embodiment, the insulative housing 70 holds the first lead 71 and the second lead 72. The first end portion 10c of the mounting substrate 10 of the light-emitting device 2 is insertable into the recess 75 of the housing 70. The number and the arrangement density of the first leads 71 are the same as the number and the arrangement density of the first terminals 21 of the light-emitting device 2, and the number and the arrangement density of the second leads 72 are the same as the number and the arrangement density of the second terminals 22 of the light-emitting device 2.

The configuration of the second connector 62 of the light-emitting module 52 is similar to the configuration of the first connector 61. Namely, an insulative housing 76 is provided in the second connector 62, and the housing 76 holds a third lead 73 and a fourth lead 74. A recess 77 is provided in the housing 76, and the second end portion 10d of the mounting substrate 10 of the light-emitting device 2 is insertable into the recess 77.

When the second end portion 10d of the mounting substrate 10 of the light-emitting device 2 is inserted into the recess 77 of the housing 76 of the second connector 62, the third lead 73 of the second connector 62 presses the third terminal 23 of the light-emitting device 2 and is connected to the third terminal 23. Also, the fourth lead 74 of the second connector 62 presses the fourth terminal 24 of the light-emitting device 2 and is connected to the fourth terminal 24. Thereby, the second connector 62 clamps the second end portion 10d of the mounting substrate 10 of the light-emitting device 2 from both the first surface 10a side and the second surface 10b side. Thus, the light-emitting device 2 is fixed to the second connector 62 by inserting the second end portion 10d of the mounting substrate 10 into the recess 77.

Similarly to the first embodiment, it is favorable for the first lead 71, the second lead 72, the third lead 73, and the fourth lead 74 to be springlike. Thereby, the light-emitting device 2 can be reliably connected to the light-emitting module 52 so that the light-emitting device 2 is detachable from the light-emitting module 52.

Thus, in the light-emitting module 52, the first connector 61 clamps the first end portion 10c of the mounting substrate 10, and the second connector 62 clamps the second end portion 10d of the mounting substrate 10. As a result, the light-emitting device 2 is fixed by the first connector 61 and the second connector 62. The first lead 71 of the first connector 61 is connected to the first terminal 21 of the light-emitting device 2, the second lead 72 of the first connector 61 is connected to the second terminal 22, the third lead 73 of the second connector 62 is connected to the third terminal 23, and the fourth lead 74 of the second connector 62 is connected to the fourth terminal 24.

Effects of the embodiment will now be described.

In the light-emitting device 2 according to the embodiment, the terminals that are connected to the light-emitting elements 11, i.e., the first terminals 21, the second terminals 22, the third terminals 23, and the fourth terminals 24, are dispersed at a total of four locations, i.e., the first surface 10a and the second surface 10b of the first end portion 10c of the mounting substrate 10 and the first surface 10a and the second surface 10b of the second end portion 10d. As a result, the layout area of the terminals can be reduced even more, or the arrangement density can be reduced even more. Thereby, the light-emitting device 2 can be downsized further.

Also, in the light-emitting module 52 according to the embodiment, the mechanical stability is high and the reliability is high because the light-emitting device 2 is fixed at two sides in the second direction V2 by the first connector 61 and the second connector 62.

Otherwise, the configuration and the effects of the embodiment are similar to those of the first embodiment.

It is possible for the light-emitting device to include only three types of terminals among the first terminal 21, the second terminal 22, the third terminal 23, and the fourth terminal 24.

Modification of Second Embodiment

A modification of the second embodiment will now be described.

The front view showing a light-emitting device according to the modification is similar to FIG. 7, and the rear view showing the light-emitting device according to the modification is similar to FIG. 8.

Figure 12:
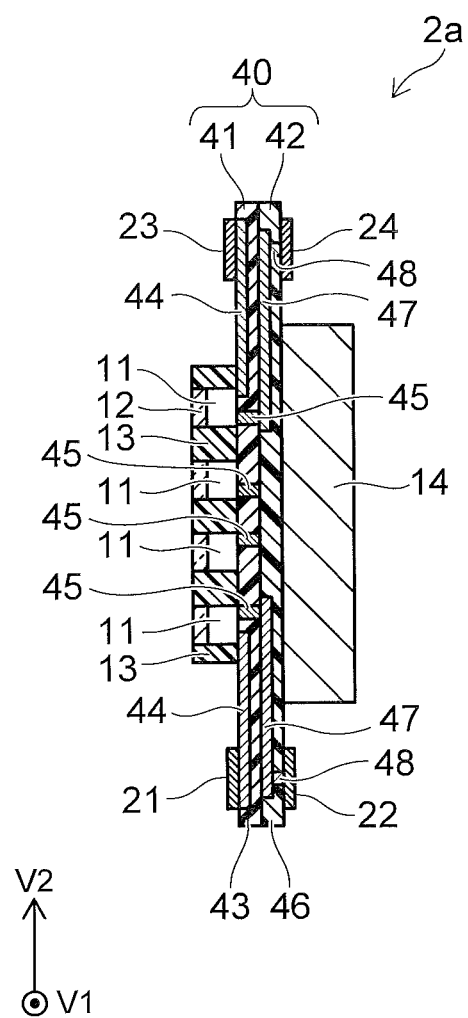
FIG. 12 is a cross-sectional view showing a light-emitting device according to a modification of the second embodiment.

In the light-emitting device 2a according to the modification as shown in FIG. 12, similarly to the modification of the first embodiment described above, a stacked substrate is provided as the mounting substrate 40. The configuration of the mounting substrate 40 is as described in the modification of the first embodiment.

An example of the connection between the terminals and the light-emitting elements 11 will now be described.

The anode of each light-emitting element 11 is connected to some first terminal 21 or some third terminal 23 via some interconnect 44 of the first interconnect layer 41. For example, among the light-emitting elements 11 arranged in four columns, the anodes of the light-emitting elements 11 belonging to the two columns on the first terminal 21 side may be connected to the first terminals 21, and the anodes of the light-emitting elements 11 belonging to the two columns on the third terminal 23 side may be connected to the third terminals 23.

The cathode of each light-emitting element 11 is connected to some second terminal 22 or some fourth terminal 24 by some via 45 of the first interconnect layer 41, some interconnect 47 of the second interconnect layer 42, or some via 48 of the second interconnect layer 42. For example, among the light-emitting elements 11 arranged in four columns, the cathodes of the light-emitting elements 11 belonging to the two columns on the second terminal 22 side may be connected to the second terminals 22, and the cathodes of the light-emitting elements 11 belonging to the two columns on the fourth terminal 24 side may be connected to the fourth terminals 24.

In the modification as well, the interconnect density in the mounting substrate 40 can be reduced by using a stacked substrate as the mounting substrate 40. Otherwise, the configuration and the effects of the modification are similar to those of the second embodiment.

Although an example is described above in which the first terminal 21 and the third terminal 23 provided at the first surface 40a of the mounting substrate 40 are connected to the anodes of the light-emitting elements 11, and the second terminal 22 and the fourth terminal 24 provided at the second surface 40b of the mounting substrate 40 are connected to the cathodes of the light-emitting elements 11, this is not limited thereto. For example, the first terminal 21 and the second terminal 22 may be connected to the anodes of the light-emitting elements 11, and the third terminal 23 and the fourth terminal 24 may be connected to the cathodes of the light-emitting elements 11. Also, the connectional relationship of the anode and the cathode may be the reverse of the example described above. For example, the anode and the cathode of one light-emitting element 11 may be connected to two first terminals 21 or may be connected to two third terminals 23 via two interconnects 44 of the first interconnect layer 41. The anode and the cathode of another one light-emitting element 11 may be connected to two second terminals 22 or may be connected to two fourth terminals 24 by two vias 45 of the first interconnect layer 41, two interconnects 47 of the second interconnect layer 42, and two vias 48 of the second interconnect layer 42.

Third Embodiment

A third embodiment will now be described.

A light-emitting device 3 according to the embodiment includes: the mounting substrate 10 having the first surface 10a, and the second surface 10b opposite to the first surface 10a; the multiple light-emitting elements 11 mounted at the first surface 10a of the mounting substrate 10; and a first terminal 25 provided at the first end portion 10c of the mounting substrate 10, exposed at the first surface 10a and the second surface 10b, and connected to at least one of the light-emitting elements 11.

The first terminal 25 may include a first part 25a provided at the first surface 10a of the mounting substrate 10, a second part 25b provided at the second surface 10b of the mounting substrate 10, and a via 25c provided in the first end portion 10c and connected to the first part 25a and the second part 25b.

The light-emitting device 3 may further include a second terminal 26 provided at the second end portion 10d of the mounting substrate 10 which is different from the first end portion 10c, exposed at the first surface 10a and the second surface 10b, and connected to at least one of the light-emitting elements 11.

The second terminal 26 may include a first part 26a provided at the first surface 10a of the mounting substrate 10, a second part 26b provided at the second surface 10b of the mounting substrate 10, and a via 26c provided in the second end portion 10d and connected to the first part 26a and the second part 26b.

A more detailed description follows.

Figure 13:
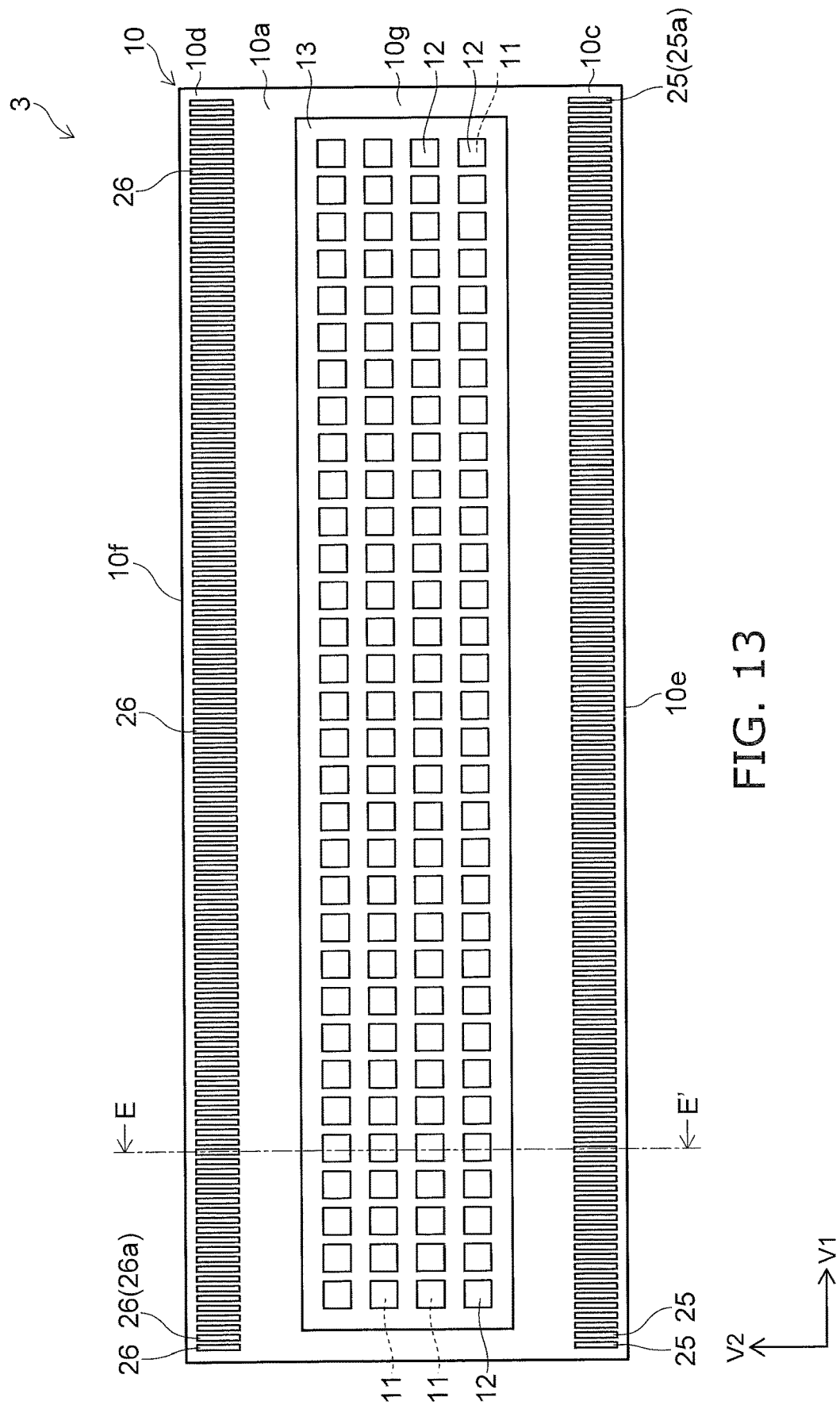
FIG. 13 is a front view showing a light-emitting device according to a third embodiment.
Figure 14:
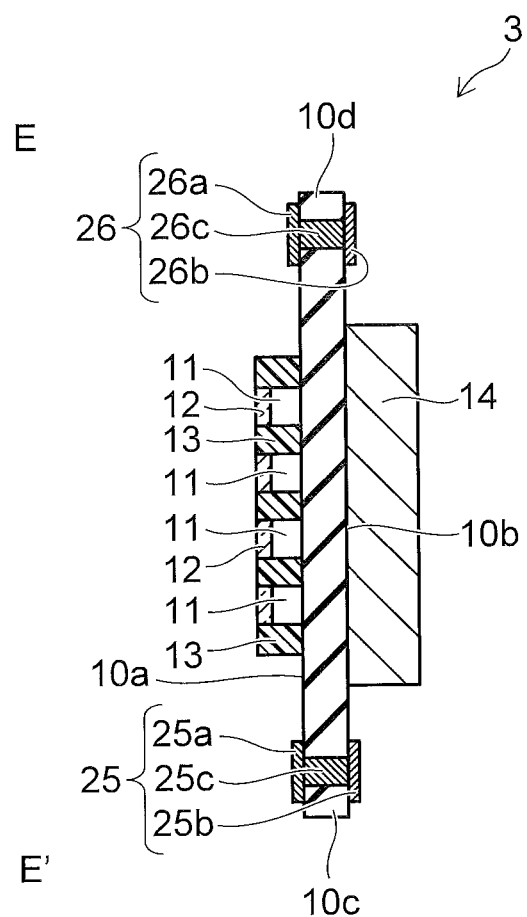
FIG. 14 is a cross-sectional view showing the light-emitting device according to the third embodiment and shows a cross section along line E-E' shown in FIG. 13.
Figure 14:
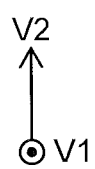

In the light-emitting device 3 according to the embodiment as shown in FIG. 13 and FIG. 14, the first terminals 25 are provided at the first end portion 10c of the mounting substrate 10. The first terminals 25 are connected to the light-emitting elements 11. Multiple first terminals 25 are arranged in one column along the first direction V1. The via 25c of the first terminal 25 pierces the mounting substrate 10 in the thickness direction. One end of the via 25c is connected to the first part 25a, and another end of the via 25c is connected to the second part 25b.

The first part 25a of the first terminal 25 corresponds to the first terminal 21 of the light-emitting device 2 according to the second embodiment. The second part 25b of the first terminal 25 corresponds to the second terminal 22 of the light-emitting device 2. The via 25c of the first terminal 25 corresponds to a connection member connecting the first terminal 21 to the second terminal 22. The first part 25a of the first terminal 25, the second part 25b, and the via 25c may be formed to have a continuous body.

Similarly, in the light-emitting device 3, the second terminals 26 are provided at the second end portion 10d of the mounting substrate 10. The second terminals 26 are connected to the light-emitting elements 11. Multiple second terminals 26 are arranged in one column along the first direction V1. The via 26c of the second terminal 26 pierces the mounting substrate 10 in the thickness direction. One end of the via 26c is connected to the first part 26a, and another end of the via 26c is connected to the second part 26b.

The first part 26a of the second terminal 26 corresponds to the third terminal 23 of the light-emitting device 2 according to the second embodiment. The second part 26b of the second terminal 26 corresponds to the fourth terminal 24 of the light-emitting device 2. The via 26c of the second terminal 26 corresponds to a connection member connecting the third terminal 23 to the fourth terminal 24. The first part 26a, the second part 26b, and the via 26c of the second terminal 26 may be formed to have a continuous body.

The total number of the first terminals 25 and the second terminals 26 is, for example, equal to 2 times the number of the light-emitting elements 11. For example, the number of the first terminals 25 is equal to the number of the light-emitting elements 11, and the number of the second terminals 26 is equal to the number of the light-emitting elements 11. In the example shown in FIG. 13 and FIG. 14, the number of the light-emitting elements 11, the number of the first terminals 25, and the number of the second terminals 26 each are 128.

A light-emitting module according to the embodiment will now be described.

Figure 15:
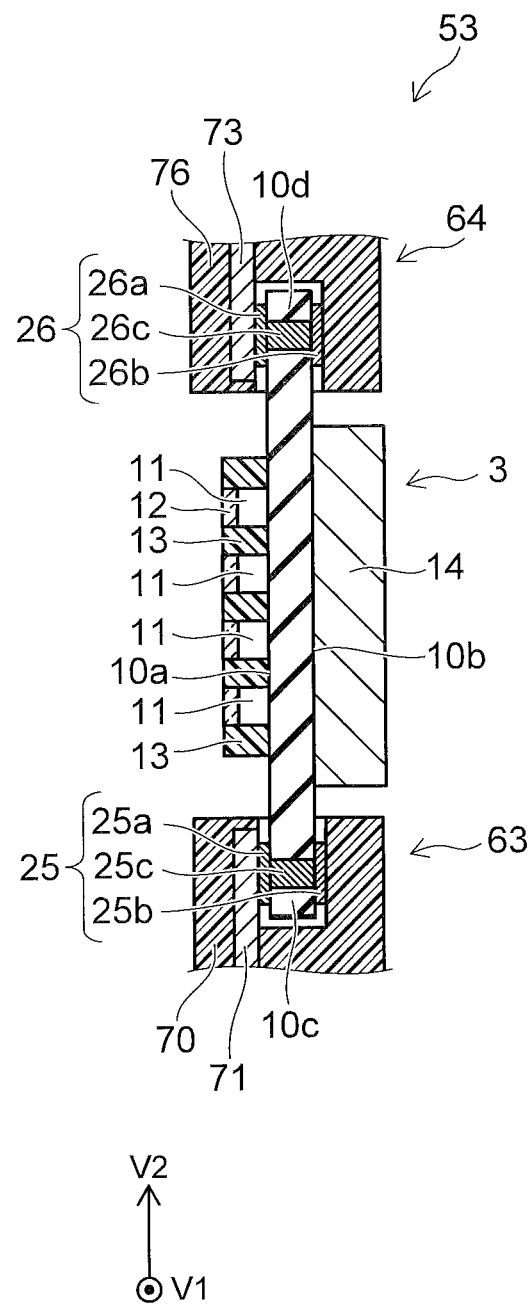
FIG. 15 is a cross-sectional view showing a light-emitting module according to the third embodiment.

As shown in FIG. 15, the light-emitting module 53 according to the embodiment includes the light-emitting device 3 described above, a third connector 63, and a fourth connector 64.

The third connector 63 is the first connector 61 of the second embodiment from which the second lead 72 is omitted. The fourth connector 64 is the second connector 62 of the second embodiment from which the fourth lead 74 is omitted. The first lead 71 of the third connector 63 presses the first part 25a of the first terminal 25 and is connected to the first terminal 25. The third lead 73 of the fourth connector 64 presses the first part 26a of the second terminal 26 and is connected to the second terminal 26.

The third connector 63 may be the first connector 61 from which the first lead 71 is omitted, and the fourth connector 64 may be the second connector 62 from which the third lead 73 is omitted.

Effects of the embodiment will now be described.

In the light-emitting device 3 of the embodiment, the first terminal 25 and the second terminal 26 are exposed at both the first surface 10a and the second surface 10b of the mounting substrate 10. Thereby, the degrees of freedom of the connectors when assembling the light-emitting module 53 are higher. For example, as the connector clamping the first end portion 10c of the mounting substrate 10 as described above, the third connector 63 in which only the first lead 71 is provided can be used, a connector in which only the second lead 72 is provided may be used, or the first connector 61 in which both the first lead 71 and the second lead 72 are provided may be used. This is similar for the connector clamping the second end portion 10d of the mounting substrate 10 as well.

Otherwise, the configuration and the effects of the embodiment are similar to those of the second embodiment.

Fourth Embodiment

A fourth embodiment will now be described.

A light-emitting device 4 according to the embodiment differs from the light-emitting device 3 according to the third embodiment in that a first terminal 27 is provided instead of the first terminal 25, and a second terminal 28 is provided instead of the second terminal 26. The total number of the first terminals 27 and the second terminals 28 is, for example, equal to 2 times the number of the light-emitting elements 11.

The first terminal 27 may include a first part 27a provided at the first surface 10a of the mounting substrate 10, a second part 27b provided at the second surface 10b, and a third part 27c provided at an end surface 10h of the first end portion 10c and connected to the first part 27a and the second part 27b. The second terminal 28 may include a first part 28a provided at the first surface 10a of the mounting substrate 10, a second part 28b provided at the second surface 10b, and a third part 28c provided at an end surface 10i of the second end portion 10d and connected to the first part 28a and the second part 28b.

A more detailed description follows.

Figure 16:
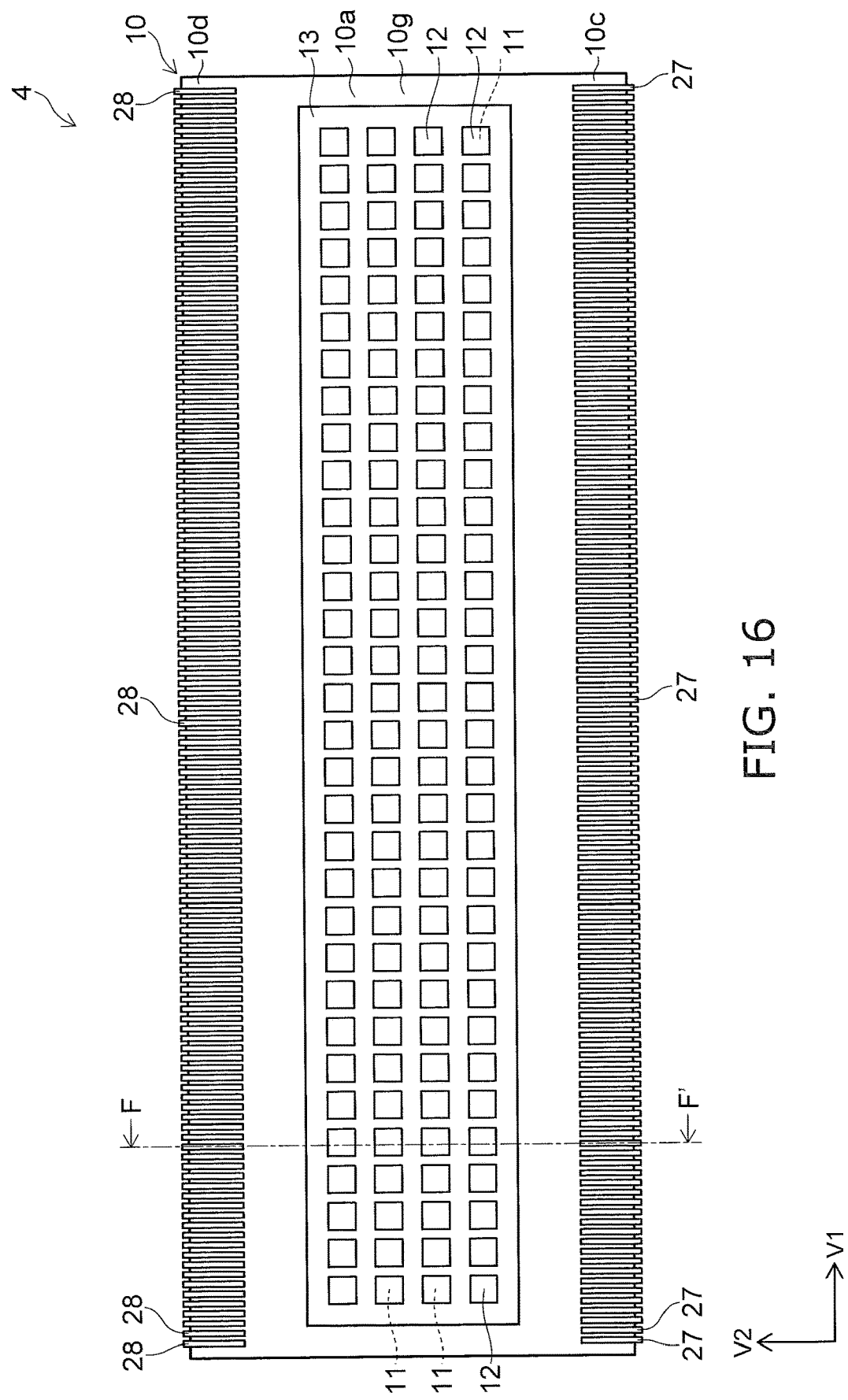
FIG. 16 is a front view showing a light-emitting device according to a fourth embodiment.
Figure 17:
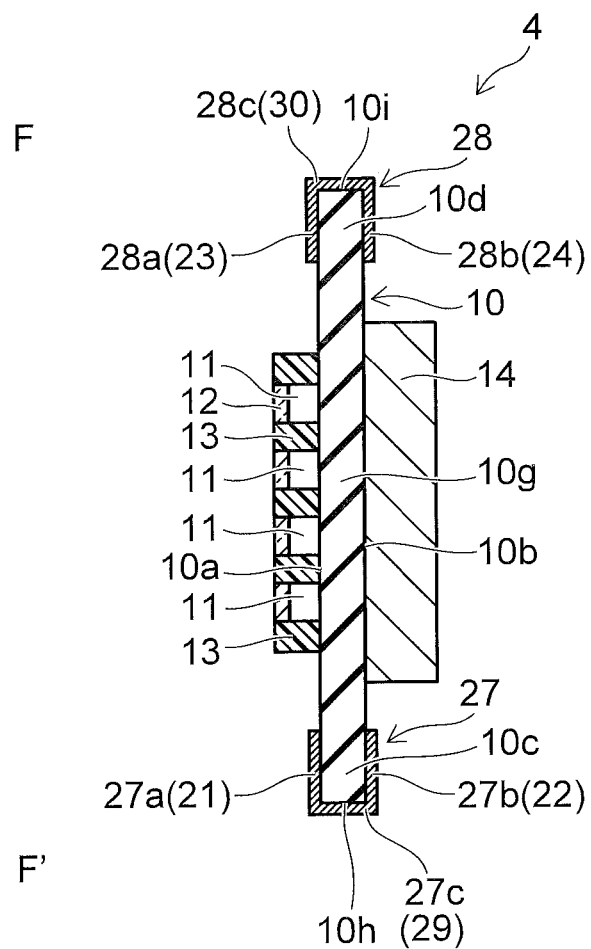
FIG. 17 is a cross-sectional view showing the light-emitting device according to the fourth embodiment and shows a cross section along line F-F' shown in FIG. 16.

As shown in FIG. 16 and FIG. 17, the first terminals 27 have C-shaped configurations when viewed along the first direction V1 and are provided over the first surface 10a of the first end portion 10c, the end surface 10h, and the second surface 10b. The first part 27a of the first terminal 27 corresponds to the first terminal 21 of the light-emitting device 2 according to the second embodiment; the second part 27b of the first terminal 27 corresponds to the second terminal 22 of the light-emitting device 2; the third part 27c of the first terminal 27 corresponds to a connection member 29 that is provided at the end surface 10h of the first end portion 10c of the mounting substrate 10 and connects the first terminal 21 to the second terminal 22. For example, the connection member 29 and the first part 27a and the second part 27b of the first terminal 27 are formed to have a continuous body.

Similarly, the second terminals 28 have C-shaped configurations when viewed along the first direction V1 and are provided over the first surface 10a, the end surface 10i, and the second surface 10b of the second end portion 10d. The first part 28a of the second terminal 28 corresponds to the third terminal 23 of the light-emitting device 2 according to the second embodiment; the second part 28b of the second terminal 28 corresponds to the fourth terminal 24 of the light-emitting device 2; the third part 28c of the second terminal 28 corresponds to a connection member 30 that is provided at the end surface 10i of the second end portion 10d of the mounting substrate 10 and connects the third terminal 23 to the fourth terminal 24. For example, the connection member 30 and the first part 28a and the second part 28b of the second terminal 28 are formed to have a continuous body.

A light-emitting module according to the embodiment will now be described.

Figure 18:
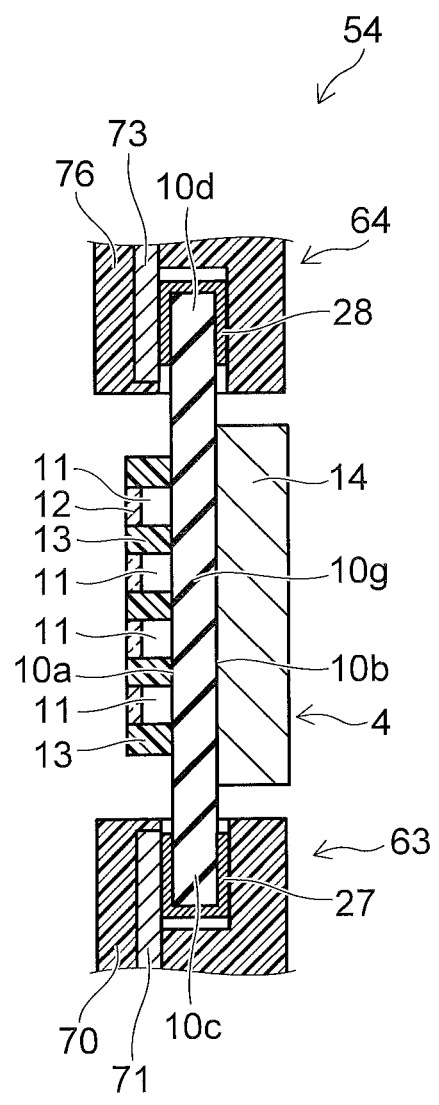
FIG. 18 is a cross-sectional view showing a light-emitting module according to the fourth embodiment.

As shown in FIG. 18, the light-emitting device 4 described above, the third connector 63, and the fourth connector 64 are provided in the light-emitting module 54 according to the embodiment. The configurations of the third connector 63 and the fourth connector 64 are as described in the third embodiment. Instead of the third connector 63, a connector may be used in which a lead contacting a part of the first terminal 27 corresponding to the connection member 29 is provided. Similarly, instead of the fourth connector 64, a connector may be used in which a lead contacting a part of the second terminal 28 corresponding to the connection member 30 is provided.

Otherwise, the configuration and the effects of the embodiment are similar to those of the third embodiment.

Fifth Embodiment

A fifth embodiment will now be described.

Figure 19:
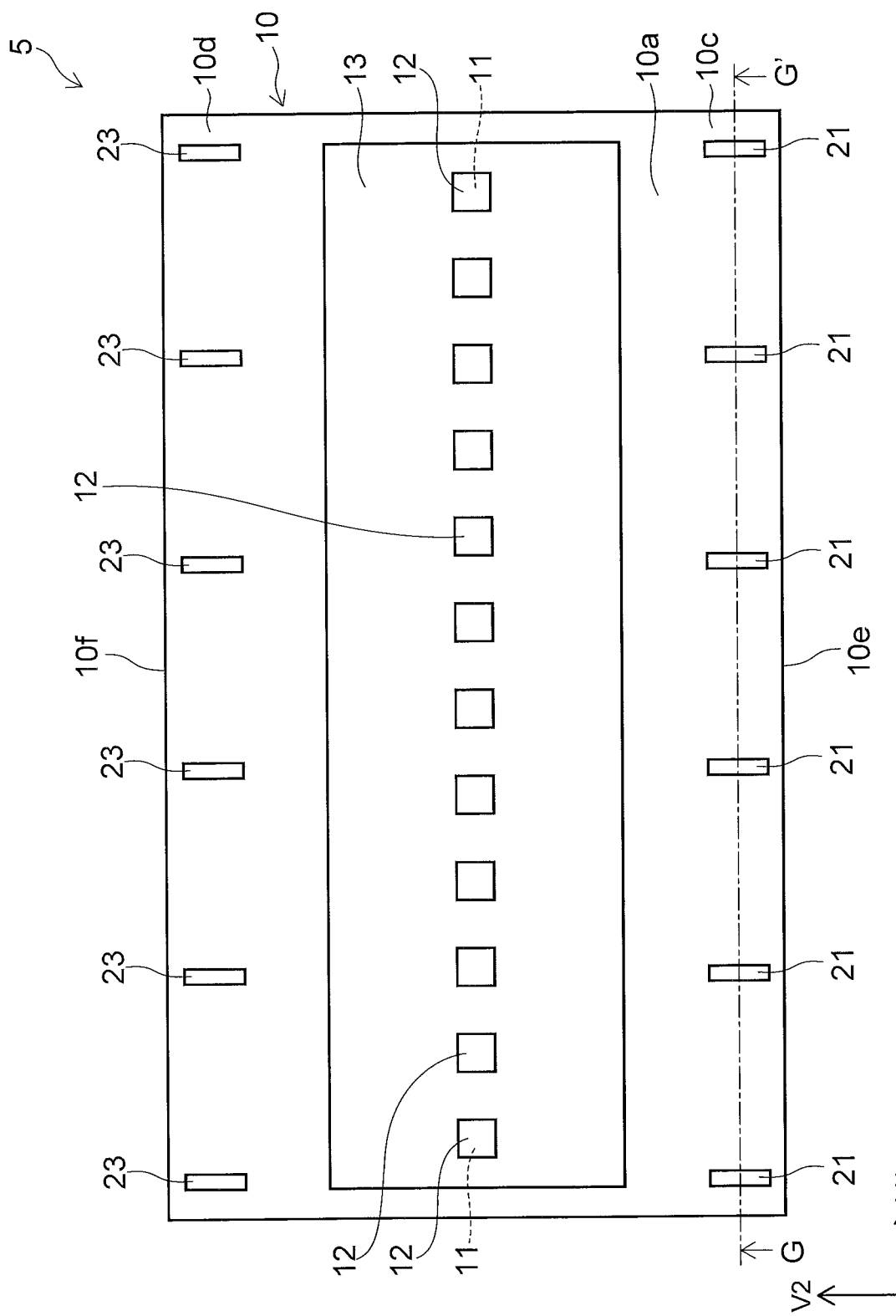
FIG. 19 is a front view showing a light-emitting device according to a fifth embodiment.
Figure 20:
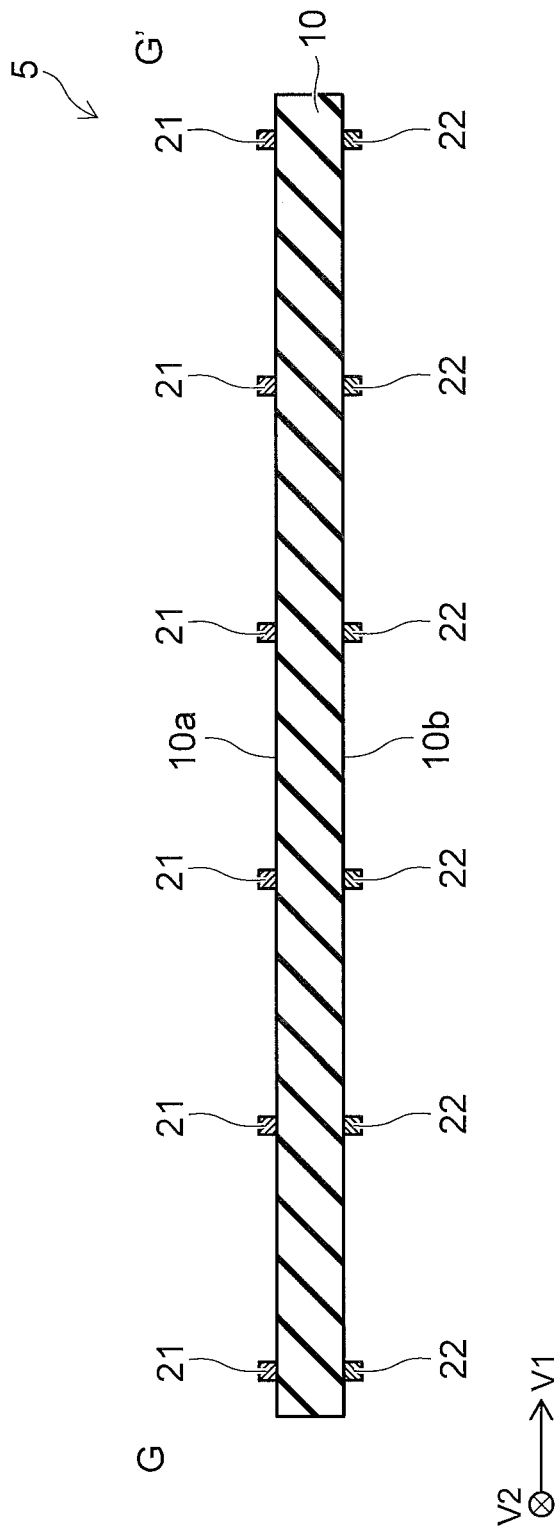
FIG. 20 is an end view showing the light-emitting device according to the fifth embodiment and shows an end surface along line G-G' shown in FIG. 19.

In a light-emitting device 5 according to the embodiment as shown in FIG. 19 and FIG. 20, the multiple light-emitting elements 11 are arranged in one column along the longitudinal direction of the mounting substrate 10 (the first direction V1). For example, the light-emitting elements 11 are arranged periodically.

The first terminal 21, the second terminal 22, the third terminal 23, and the fourth terminal 24 also are provided in the light-emitting device 5. The positions of these terminals are similar to those of the second embodiment. Namely, the first terminal 21 is provided at the first surface 10a of the first end portion 10c of the mounting substrate 10, the second terminal 22 is provided at the second surface 10b of the first end portion 10c, the third terminal 23 is provided at the first surface 10a of the second end portion 10d, and the fourth terminal 24 is provided at the second surface 10b of the second end portion 10d.

For example, the total number of the first terminals 21, the second terminals 22, the third terminals 23, and the fourth terminals 24 is equal to 2 times the number of the light-emitting elements 11. In the example shown in FIG. 19 and FIG. 20, twelve of the light-emitting elements 11 are provided, and six of each of the first terminal 21, the second terminal 22, the third terminal 23, and the fourth terminal 24 are provided.

The light-emitting module according to the embodiment includes the light-emitting device 5, the first connector 61, and the second connector 62. The configurations of the first connector 61 and the second connector 62 are similar to those of the second embodiment. However, the number of the first leads 71 is equal to the number of the first terminals 21, the number of the second leads 72 is equal to the number of the second terminals 22, the number of the third leads 73 is equal to the number of the third terminals 23, and the number of the fourth leads 74 is equal to the number of the fourth terminals 24. Otherwise, the configuration and the effects of the embodiment are similar to those of the second embodiment.

Sixth Embodiment

A sixth embodiment will now be described.

Figure 21:
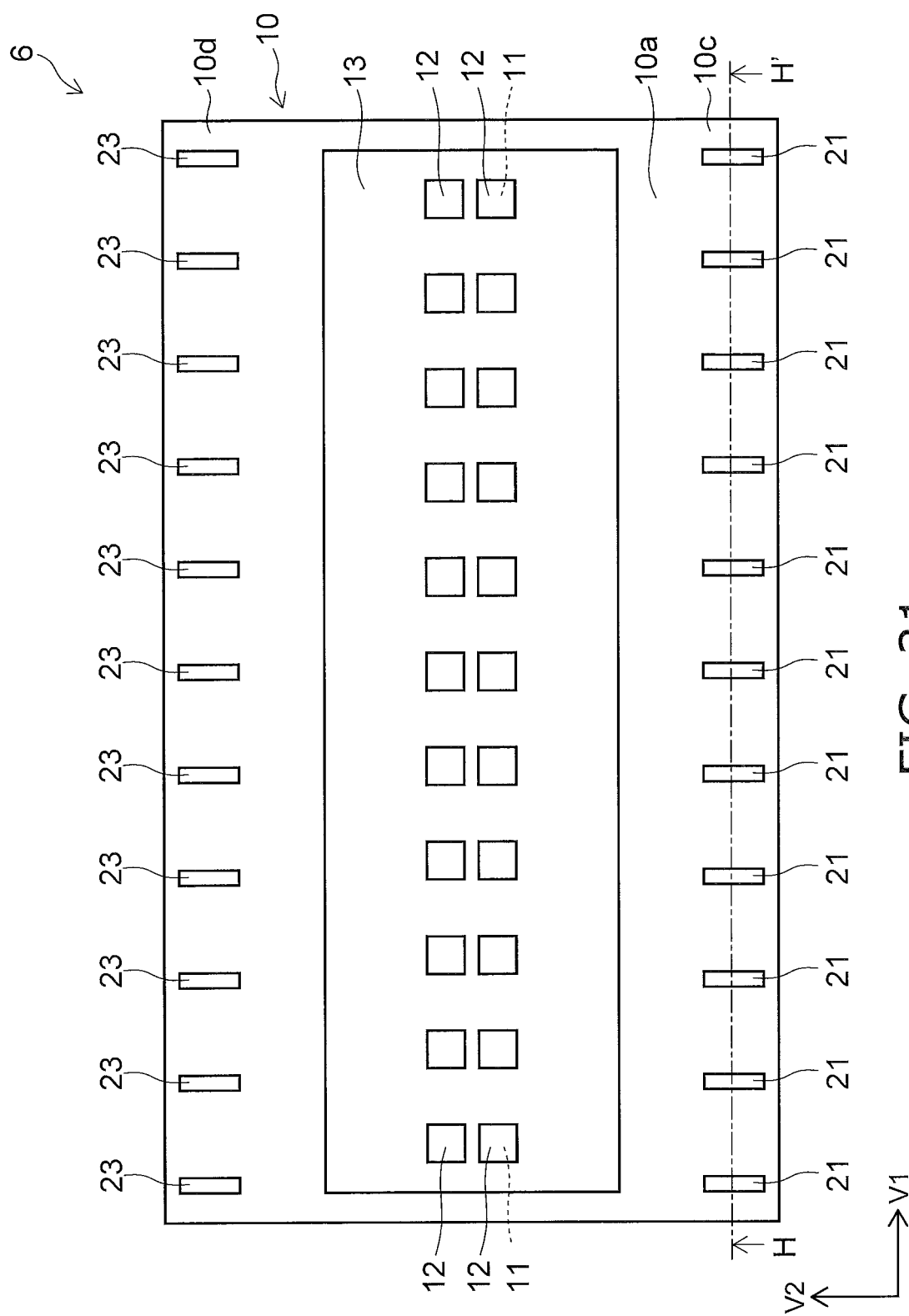
FIG. 21 is a front view showing a light-emitting device according to a sixth embodiment.
Figure 22:
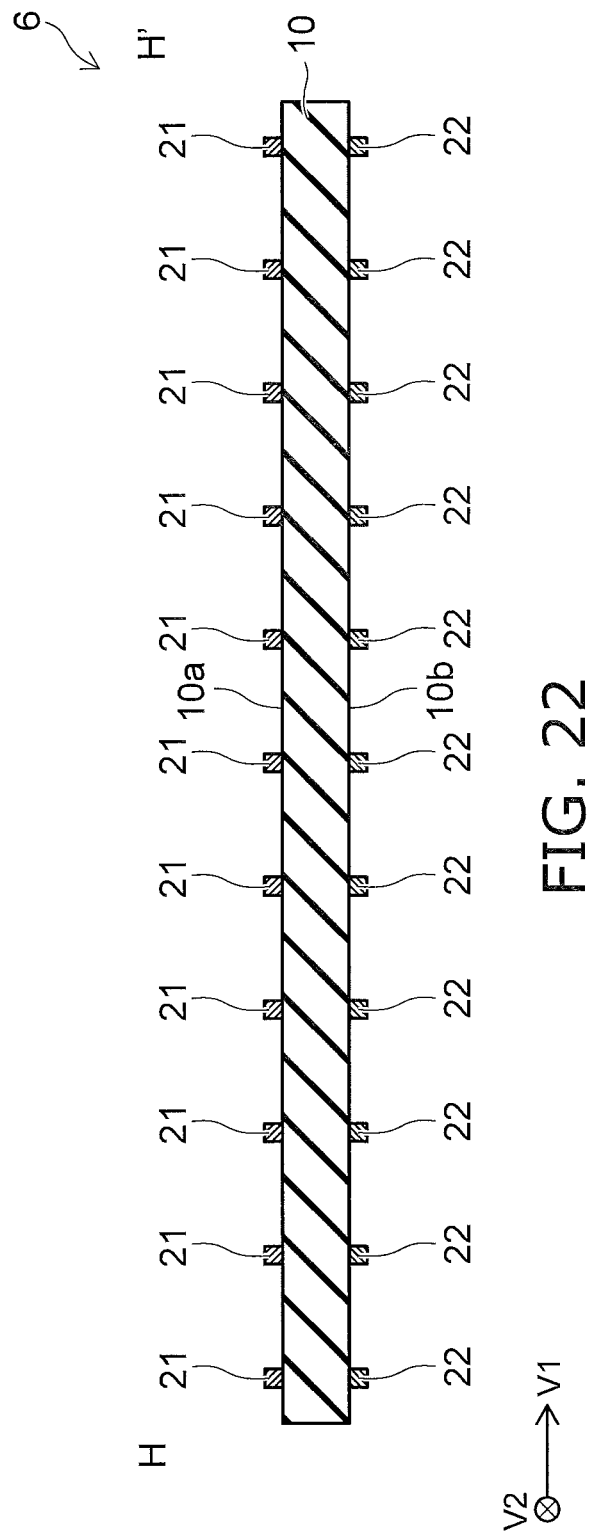
FIG. 22 is an end view showing the light-emitting device according to the sixth embodiment and shows an end surface along line H-H' shown in FIG. 21.

In a light-emitting device 6 according to the embodiment as shown in FIG. 21 and FIG. 22, the multiple light-emitting elements 11 are arranged in two columns along the longitudinal direction of the mounting substrate 10. For example, the light-emitting elements 11 are arranged periodically.

The first terminal 21, the second terminal 22, the third terminal 23, and the fourth terminal 24 also are provided in the light-emitting device 6. The positions of these terminals are similar to those of the second embodiment. In the example shown in FIG. 21 and FIG. 22, eleven of the light-emitting elements 11 are arranged along the first direction V1, two of the light-emitting elements 11 are arranged along the second direction V2, and the total number is 22. Eleven of each of the first terminal 21, the second terminal 22, the third terminal 23, and the fourth terminal 24 are provided.

The light-emitting module according to the embodiment includes the light-emitting device 6, the first connector 61, and the second connector 62. Otherwise, the configuration and the effects of the embodiment are similar to those of the fifth embodiment.

Seventh Embodiment

A seventh embodiment will now be described.

Figure 23:
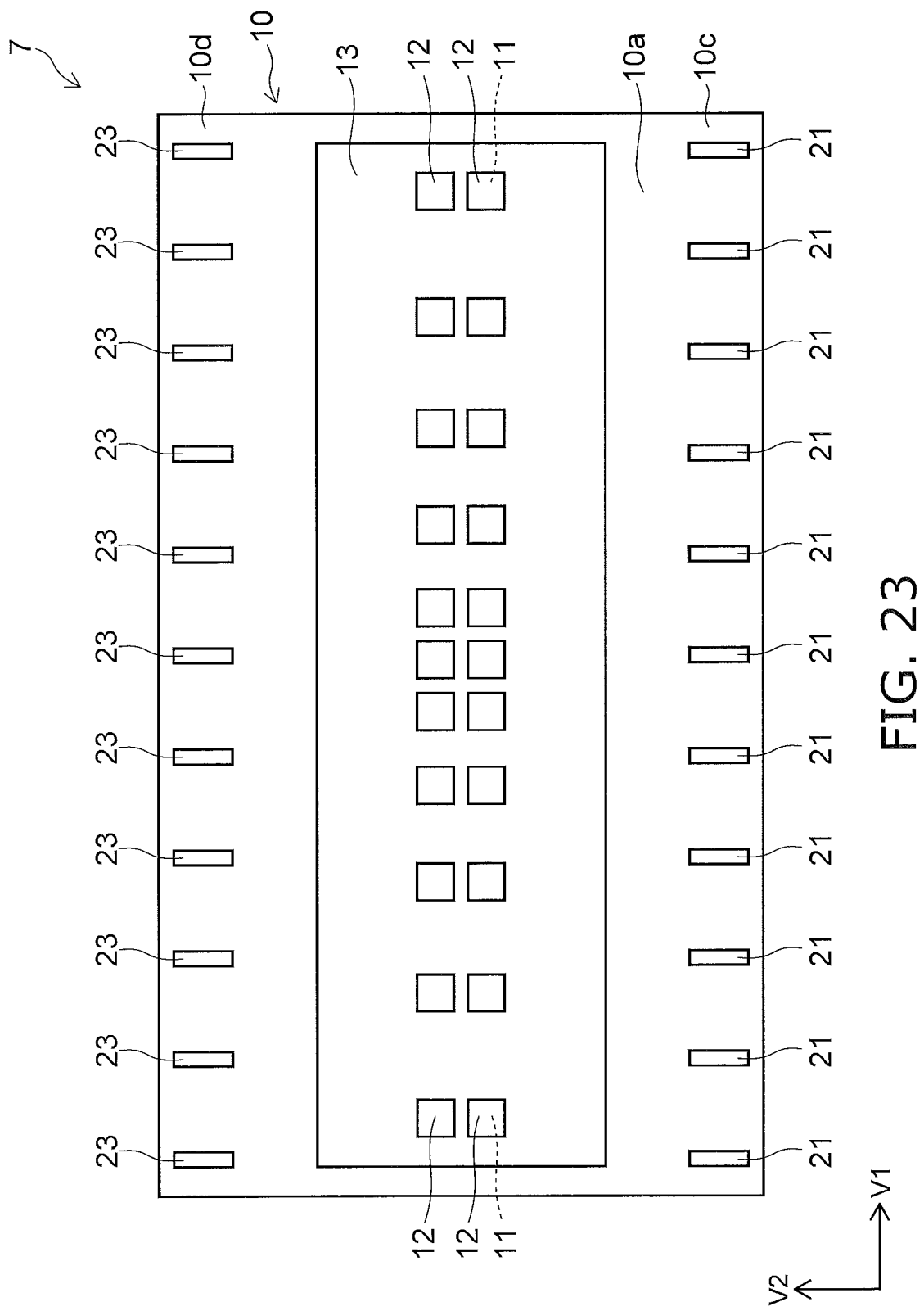
FIG. 23 is a front view showing a light-emitting device according to a seventh embodiment.

In a light-emitting device 7 according to the embodiment as shown in FIG. 23, similarly to the sixth embodiment, the multiple light-emitting elements 11 are arranged in two columns along the longitudinal direction of the mounting substrate 10. However, unlike the sixth embodiment, the light-emitting elements 11 are arranged aperiodically so that the spacing is short at the longitudinal-direction central portion of the mounting substrate 10, and the spacing lengthens at the two longitudinal-direction end portions.

On the other hand, the first terminal 21, the second terminal 22, the third terminal 23, and the fourth terminal 24 each are arranged periodically along the longitudinal direction of the mounting substrate 10. Therefore, the end view showing the light-emitting device 7 is similar to FIG. 22.

The light-emitting module according to the embodiment includes the light-emitting device 7, the first connector 61, and the second connector 62. Otherwise, the configuration and the effects of the embodiment are similar to those of the sixth embodiment.

Eighth Embodiment

An eighth embodiment will now be described.

Figure 24:
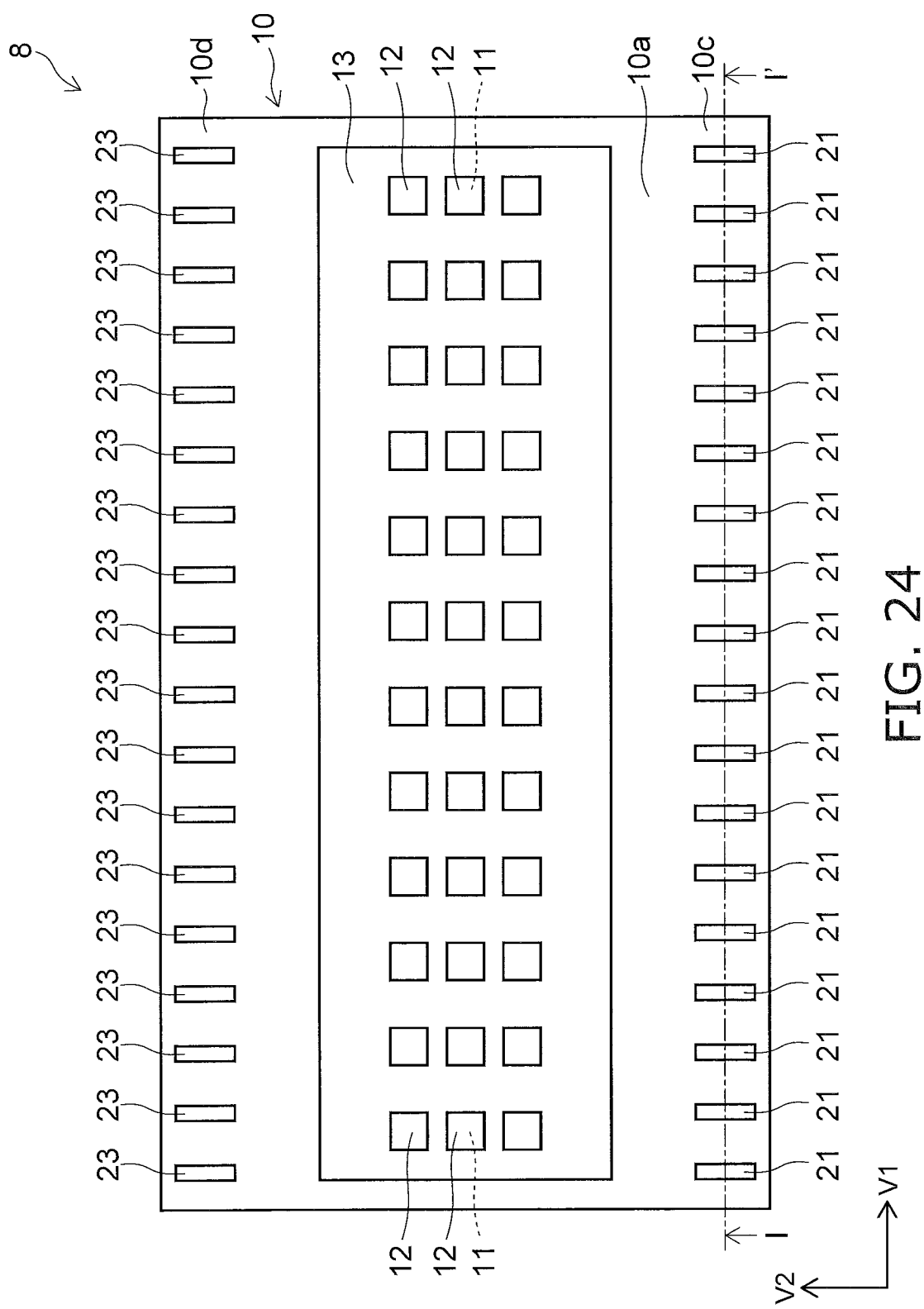
FIG. 24 is a front view showing a light-emitting device according to an eighth embodiment.
Figure 25:
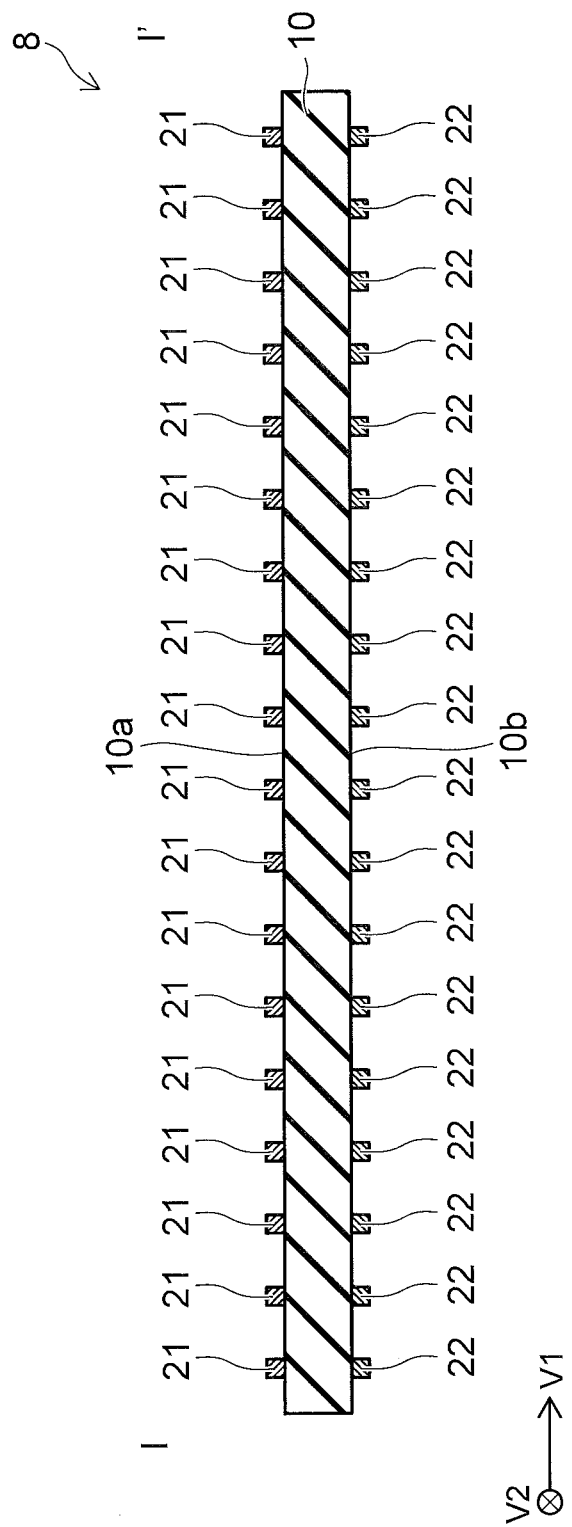
FIG. 25 is an end view showing the light-emitting device according to the eighth embodiment and shows an end surface along line I-I' shown in FIG. 24.

In a light-emitting device 8 according to the embodiment as shown in FIG. 24 and FIG. 25, the multiple light-emitting elements 11 are arranged in three columns along the longitudinal direction of the mounting substrate 10. For example, the light-emitting elements 11 are arranged periodically.

The first terminal 21, the second terminal 22, the third terminal 23, and the fourth terminal 24 also are provided in the light-emitting device 8. The positions of these terminals are similar to those of the second embodiment. In the example shown in FIG. 24 and FIG. 25, twelve of the light-emitting elements 11 are arranged along the first direction V1, three of the light-emitting elements 11 are arranged along the second direction V2, and the total number is 36. Eighteen of each of the first terminal 21, the second terminal 22, the third terminal 23, and the fourth terminal 24 are provided.

The light-emitting module according to the embodiment includes the light-emitting device 8, the first connector 61, and the second connector 62. Otherwise, the configuration and the effects of the embodiment are similar to those of the fifth embodiment.

Although an example is shown in the embodiments described above in which the light-emitting elements 11 are arranged in one to four columns along the longitudinal direction of the mounting substrate 10, the invention is not limited thereto. The light-emitting elements 11 may be arranged in five or more columns. Also, the light-emitting elements 11 may be arranged aperiodically as illustrated in the seventh embodiment. It is unnecessary for the light-emitting elements 11 to be arranged along two orthogonal directions; for example, the light-emitting elements 11 may be arranged in a circular configuration or an elliptical configuration.

The total number of the first terminals 21, the second terminals 22, the third terminals 23, and the fourth terminals 24 is not limited to 2 times the number of the light-emitting elements 11. For example, when the anode or the cathode is used commonly between the multiple light-emitting elements 11, the total number of terminals may be less than 2 times the number of the light-emitting elements 11.

For example, the invention can be utilized in the light source of a vehicle light fixture such as a headlamp, etc.

What is claimed is:

1. A light-emitting device, comprising:
a mounting substrate having a first surface and a second surface opposite to the first surface, the mounting substrate having a first end portion at an end of the mounting substrate;
light-emitting elements mounted on the first surface of the mounting substrate other than the first end portion;
first terminals provided on the first surface at the first end portion of the mounting substrate and connected to the light-emitting elements;
second terminals provided on the second surface at the first end portion of the mounting substrate and connected to the light-emitting elements; and
a heat dissipation member contacting the second surface of the mounting substrate, wherein
each of the first terminals and the second terminals has a rectangular configuration,
a shorter direction of the first terminals and the second terminals is a first direction,
a longer direction of the first terminals and the second terminals is a second direction crossing the first direction,
the first terminals are arranged in one column along the first direction, and
the second terminals are arranged in one column along the first direction.

2. The device according to claim 1, wherein the light-emitting elements are arranged along the first direction and the second direction to form a matrix configuration, the first direction extending along an edge of the first end portion.

3. The device according to claim 1, wherein
the first terminals are arranged in one column along an edge of the first end portion, and
the second terminals are arranged in one column along the edge of the first end portion.

4. The device according to claim 1, further comprising:
a connection member provided at an end surface of the first end portion to connect the first terminals to the second terminals.

5. The device according to claim 1, wherein a total number of the first terminals and the second terminals is 2 times a number of the light-emitting elements.

6. The device according to claim 1, further comprising:
third terminals provided on the first surface at a second end portion of the mounting substrate and connected to the light-emitting elements, the second end portion being different from the first end portion; and
fourth terminals provided on the second surface at the second end portion of the mounting substrate and connected to the light-emitting elements.

7. The device according to claim 6, wherein
the third terminals are arranged in one column along an edge of the second end portion, and
the fourth terminals are arranged in one column along the edge of the second end portion.

8. The device according to claim 6, wherein a total number of the first terminals, the second terminals, the third terminals, and the fourth terminals is 2 times a number of the light-emitting elements.

9. The device according to claim 6, wherein
the mounting substrate has a rectangular plate configuration, and
the second end portion is positioned at a side opposite to the first end portion.

10. A light-emitting module, comprising:
the light-emitting device according to claim 1; and
a first connector clamping the first end portion of the mounting substrate, including a first lead connected to the first terminals, and including a second lead connected to the second terminals.

11. A light-emitting module, comprising:
the light-emitting device according to claim 6;
a first connector clamping the first end portion of the mounting substrate, including a first lead connected to the first terminals, and including a second lead connected to the second terminals; and
a second connector clamping the second end portion of the mounting substrate, including a third lead connected to the third terminals, and including a fourth lead connected to the fourth terminals.

12. The device according to claim 1, wherein
when viewed from the first surface side, an entirety of the outer profile of the heat dissipation member is located inside an outer profile of the mounting substrate.

13. The device according to claim 1, wherein no terminal is provided at a portion of the mounting substrate other than the first end portion.

14. A light-emitting device, comprising:
a mounting substrate having a first surface and a second surface opposite to the first surface, the mounting substrate having a first end portion at an end of the mounting substrate;
light-emitting elements mounted at the first surface of the mounting substrate;
first terminals provided at the first end portion of the mounting substrate, exposed at the first surface and the second surface, and connected to at least one of the light-emitting elements; and
a heat dissipation member contacting the second surface of the mounting substrate, wherein
each of the first terminals includes:
a first part provided at the first surface; and
a second part provided at the second surface,
each of the first parts and the second parts has a rectangular configuration,
a shorter direction of the first parts and the second parts is a first direction,
a longer direction of the first parts and the second parts is a second direction crossing the first direction,
the first parts are arranged in one column along the first direction, and
the second parts are arranged in one column along the first direction.

15. The device according to claim 14, wherein one of the first terminals further includes:
   a via provided in the first end portion and connected to the first part and the second part.

16. The device according to claim 14, wherein one of the first terminals further includes:
   a third part provided at an end surface of the first end portion and connected to the first part and the second part.

17. The device according to claim 14, further comprising:
   a second terminal provided at a second end portion of the mounting substrate, exposed at the first surface and the second surface, and connected to at least one of the light-emitting elements, the second end portion being different from the first end portion.

18. The device according to claim 14, wherein when viewed from the first surface side, an entirety of the outer profile of the heat dissipation member is located inside an outer profile of the mounting substrate.

19. The device according to claim 14, wherein no terminal is provided at a portion of the mounting substrate other than the first end portion.

* * * * *